United States Patent
Korkmaz et al.

(10) Patent No.: US 11,127,588 B2
(45) Date of Patent: Sep. 21, 2021

(54) SEMICONDUCTOR PROCESSING APPLYING SUPERCRITICAL DRYING

(71) Applicant: Micron Technology, Inc., Boise, ID (US)

(72) Inventors: Sevim Korkmaz, Boise, ID (US); Sanjeev Sapra, Boise, ID (US); Jerome A. Imonigie, Boise, ID (US); Armin Saeedi Vahdat, Boise, ID (US)

(73) Assignee: Micron Technology, Inc., Boise, ID (US)

(*) Notice: Subject to any disclaimer, the term of this patent is extended or adjusted under 35 U.S.C. 154(b) by 141 days.

(21) Appl. No.: 16/383,159

(22) Filed: Apr. 12, 2019

(65) Prior Publication Data
US 2020/0328076 A1 Oct. 15, 2020

(51) Int. Cl.
H01L 21/02 (2006.01)
H01L 27/108 (2006.01)
H01L 49/02 (2006.01)
H01L 21/67 (2006.01)

(52) U.S. Cl.
CPC .. *H01L 21/02101* (2013.01); *H01L 27/10867* (2013.01); *H01L 28/91* (2013.01); *H01L 21/67034* (2013.01); *H01L 27/1082* (2013.01); *H01L 27/1085* (2013.01); *H01L 27/10852* (2013.01); *H01L 28/40* (2013.01)

(58) Field of Classification Search
CPC ......... H01L 21/02101; H01L 27/10867; H01L 28/91; H01L 27/10852; H01L 28/40; H01L 27/1085; H01L 27/1082; H01L 21/67034; F26B 7/00
See application file for complete search history.

(56) References Cited

U.S. PATENT DOCUMENTS

| 7,662,693 B2 | 2/2010 | Bhattacharyya |
| 7,875,529 B2 | 1/2011 | Forbes et al. |
| 8,274,777 B2 | 9/2012 | Kiehlbauch |

(Continued)

FOREIGN PATENT DOCUMENTS

| CN | 1691274 A | 11/2005 |
| CN | 104919574 A | 9/2015 |
| TW | 201239967 A | 10/2012 |

OTHER PUBLICATIONS

First Office Action from related Chinese patent application No. 202010125216.6, dated Jul. 21, 2021, 20 pages.

*Primary Examiner* — Ermias T Woldegeorgis
(74) *Attorney, Agent, or Firm* — Brooks, Cameron & Huebsch, PLLC

(57) ABSTRACT

Methods, apparatuses, and systems related to semiconductor processing (e.g., of a capacitor support structure) are described. An example method includes patterning a surface of a semiconductor substrate to have a first silicate material, a nitride material over the first silicate material, and a second silicate material over the nitride material. The method further includes removing the first silicate material and the second silicate material and leaving the nitride material as a support structure for a column formed from a capacitor material. The method further includes performing supercritical drying on the column, after removal of the first and second silicate materials, to reduce a probability of the column wobbling relative to otherwise drying the column after the removal of the first and second silicate materials.

25 Claims, 13 Drawing Sheets

(56) References Cited

U.S. PATENT DOCUMENTS

| | | |
|---|---|---|
| 8,748,283 B2 * | 6/2014 | Huang .............. H01L 21/02244 438/386 |
| 10,347,511 B2 | 7/2019 | Verhaverbeke |
| 2005/0198857 A1 | 9/2005 | Nakazawa |
| 2012/0240426 A1 | 9/2012 | Hayashi |
| 2013/0260529 A1 | 10/2013 | Huang |
| 2018/0190485 A1 | 7/2018 | Jang |

\* cited by examiner

1070

```
┌─────────────────────────────────────────────────────────────┐
│ PATTERNING A SURFACE OF A SEMICONDUCTOR SUBSTRATE           │
│ TO HAVE A FIRST SILICATE MATERIAL, A NITRIDE MATERIAL OVER  │──1071
│ THE FIRST SILICATE MATERIAL, AND A SECOND SILICATE MATERIAL │
│ OVER THE NITRIDE MATERIAL                                   │
└─────────────────────────────────────────────────────────────┘
                              │
┌─────────────────────────────────────────────────────────────┐
│ REMOVING THE FIRST SILICATE MATERIAL                        │──1072
│ AND THE SECOND SILICATE MATERIAL                            │
└─────────────────────────────────────────────────────────────┘
                              │
┌─────────────────────────────────────────────────────────────┐
│ LEAVING THE NITRIDE MATERIAL AS A SUPPORT STRUCTURE         │──1073
│ FOR A COLUMN FORMED FROM A CAPACITOR MATERIAL               │
└─────────────────────────────────────────────────────────────┘
                              │
┌─────────────────────────────────────────────────────────────┐
│ REDUCING A SURFACE TENSION FORCE AT A PHASE BOUNDARY        │
│ BY USING SUPERCRITICAL CARBON DIOXIDE ($CO_2$)              │──1074
│ TO DRY THE COLUMN AFTER REMOVAL OF THE FIRST                │
│ AND SECOND SILICATE MATERIALS, WHEREIN:                     │
└─────────────────────────────────────────────────────────────┘
                              │
┌─────────────────────────────────────────────────────────────┐
│ BY REDUCTION OF THE SURFACE TENSION FORCE DURING THE DRYING,│
│ A PROBABILITY OF THE COLUMN WOBBLING IS REDUCED             │──1075
│ RELATIVE TO OTHERWISE DRYING THE COLUMN                     │
└─────────────────────────────────────────────────────────────┘
                              │
┌─────────────────────────────────────────────────────────────┐
│ BY REDUCTION OF THE PROBABILITY OF THE COLUMN WOBBLING,     │
│ THE NITRIDE MATERIAL IS ENABLED TO BE                       │──1076
│ THE SINGLE SUPPORT STRUCTURE FOR THE COLUMN                 │
└─────────────────────────────────────────────────────────────┘
```

*Fig. 10*

SEMICONDUCTOR PROCESSING APPLYING SUPERCRITICAL DRYING

TECHNICAL FIELD

The present disclosure relates generally to semiconductor devices and methods, and more particularly to semiconductor processing (e.g., of a capacitor support structure).

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

BRIEF DESCRIPTION OF THE DRAWINGS

FIGS. 8-10 are flow diagrams of example methods for fabrication sequences for semiconductor processing in accordance with a number of embodiments of the present disclosure.

DETAILED DESCRIPTION

Figure 1:
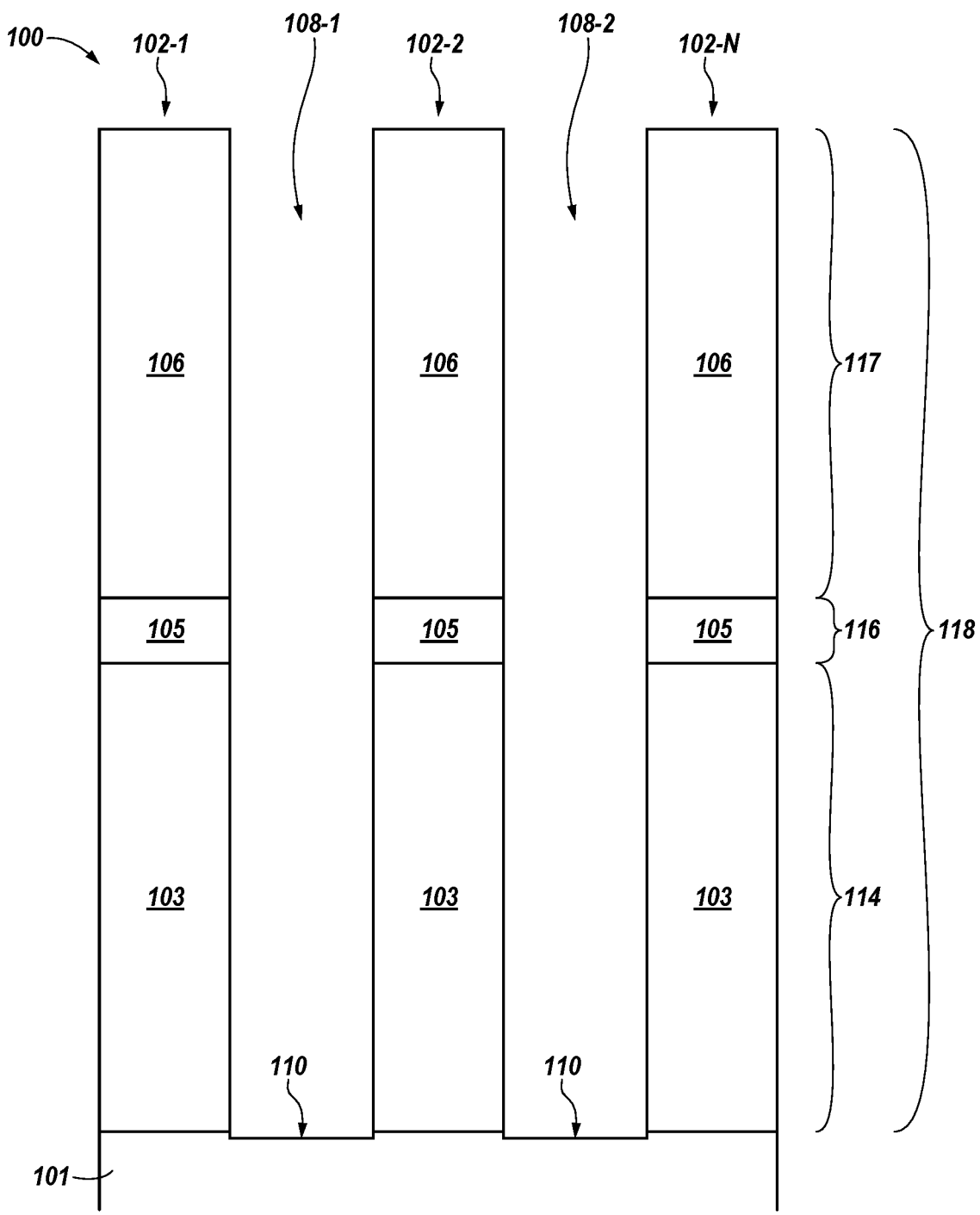
FIGS. 1-7 illustrate cross-sectional views of a portion of an example memory device at stages of an example fabrication sequence for semiconductor processing of a capacitor support structure in accordance with a number of embodiments of the present disclosure.

Various types of semiconductor structures on memory devices (e.g., those that include volatile or non-volatile memory cells) may include rectilinear trenches and/or round, square, oblong, etc., cavities that may be formed into semiconductor material to create openings thereon for subsequent semiconductor processing steps. Various materials may be deposited using chemical vapor deposition (CVD), plasma deposition, etc. and patterned using photolithographic techniques, doped and etched using vapor, wet and/or dry etch processes to form semiconductor structures on a substrate. Such openings may contain, or be associated with, various materials that contribute to data access, storage, and/or processing, or to various support structures, on the memory device.

In one example process, a trench may be formed through one or more layers of materials to receive subsequent processing steps to form a discrete device, such as a storage node. An example of a storage node is a capacitor to a dynamic random access memory (DRAM) cell, although embodiments are not limited to this example. As design rules scale to smaller critical dimensions (CDs), deeper trenches or openings with more narrow widths may be desired. In addition, in order to increase the capacitance of a cell of the memory device, a surface area of capacitor material formed into a column, as part of a capacitor's structure, may be increased by increasing a height of the column of capacitor material within the opening.

However, due to possibly smaller gap margins and pitch, along with increasing a height to width ratio (aspect ratio or AR) of the column and the capacitor, the increased height also may increase a risk (probability) of wobbling, bending, and/or twisting of the capacitor column (e.g., during a fabrication sequence, as described herein). The increased probability of wobbling, etc., may increase a probability of a short circuit fault of a capacitor, formed using the capacitor material, during subsequent use of a memory device.

In order to mitigate this risk, a method for forming a capacitor support structure (e.g., a lattice) at a mid-height of the capacitor material is described further herein. The lattice of the support structure may, in a number of embodiments, be formed without an upper portion at, associated with, and/or connected to a top of the capacitor material. For example, a support structure having a single portion of the lattice may be connected at a mid-height position that is in a range of from around forty percent (%) to around 60% of a height of the column of the capacitor material. The single support portion may be a nitride material, as described herein, that is originally formed between supporting materials for the single portion of the lattice and the capacitor material. The supporting materials may, in a number of embodiments, include oxides and/or silicates (e.g., borophosphosilicate glass (BPSG), tetraethyl orthosilicate (TEOS), among other possible oxides and/or silicates). Following formation of the single portion of the support structure that supports the capacitor material at mid-height, the supporting materials may be removed by a solvent, wet etching, etc. To reduce potential wobbling, etc., of the column of the capacitor material without the upper portion of the support structure, the column may undergo supercritical drying, as described herein.

Many types of liquid under various conditions cross a boundary from liquid to gas during drying and a surface tension and/or capillary action of the liquid may apply a force on a solid structure that the liquid contacts. For example, a column having a high AR of the capacitor material may be susceptible to such a force. A surface tension force may cause wobbling, bending, and/or twisting of the column during drying (e.g., during and/or after removal of the supporting materials using the solvent and/or wet etching, or during other portions of the fabrication process).

Supercritical drying may be used to reduce a risk (probability) of the force from the surface tension and/or capillary action having this effect during removal of liquid from, for example, a column of capacitor material after formation of the column and/or removal of the supporting materials.

Supercritical drying is a controlled process for removal of the liquid. Supercritical drying may be applied using a particular compound at an appropriate temperature and/or pressure to result in the liquid to gas transition not crossing a phase boundary. Instead, the liquid and the gas pass through a supercritical region where the densities of the liquid phase and the gas phase become substantially equal at the critical point used for drying. Hence, at the critical point, there is no longer the force from the surface tension and/or capillary action that may result in (e.g., cause) the wobbling, etc.

Examples of usable supercritical compounds may include carbon dioxide ($CO_2$), nitrous oxide ($N_2O$), and water ($H_2O$), among other possible supercritical compounds. In a number of embodiments, supercritical drying also may be used to remove liquid from other materials and/or structures associated with the capacitor material. For example, supercritical drying may be used to dry electrodes, dielectric materials, and/or the single support structure positioned at mid-height of the column of capacitor material.

The present disclosure includes methods, apparatuses, and systems related to semiconductor processing (e.g., of a capacitor support structure). An example of a method described herein includes patterning a surface of a semiconductor substrate to have a first silicate material, a nitride material over the first silicate material, and a second silicate material over the nitride material. The example method further includes removing the first silicate material and the second silicate material and leaving the nitride material as a support structure for a column formed from a capacitor material. The example method further includes performing supercritical drying on the column, after removal of the first and second silicate materials, to reduce a probability of the column wobbling, etc., relative to otherwise drying the column after the removal of the first and second silicate materials. "Otherwise drying" is intended to mean using a drying process on the capacitor material, and associated structures, other than the supercritical drying process described herein.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" something can refer to one or more such things. For example, a number of capacitors can refer to at least one capacitor.

The figures herein follow a numbering convention in which the first digit or digits correspond to the figure number of the drawing and the remaining digits identify an element or component in the drawing. Similar elements or components between different figures may be identified by the use of similar digits. For example, reference numeral 108 may reference element "08" in FIG. 1, and a similar element may be referenced as 208 in FIG. 2. In some instances, a plurality of similar, but functionally and/or structurally distinguishable, elements or components in the same figure or in different figures may be referenced sequentially with the same element number (e.g., 102-1, 102-2, and 102-N in FIG. 1).

FIG. 1 illustrates a cross-sectional view of a portion of an example memory device at a particular stage in an example semiconductor fabrication sequence for forming a capacitor support structure in accordance with a number of embodiments of the present disclosure. The fabrication sequence illustrated in FIG. 1 is shown at a point 100 in time that corresponds to various processing activities already having been performed in the fabrication sequence.

The example memory device at point 100 may include a plurality of pillars 102-1, 102-2, . . . , 102-N (hereinafter referred to collectively as plurality of pillars 102) used to form semiconductor structures to a memory device. In the example pillar structure shown in FIG. 1 each of the plurality of pillars 102 may include a first silicate material 103, shown to have been formed over an underlying substrate material 101. The substrate material 101 may be formed from various undoped or doped materials on which memory device materials may be fabricated. Examples of a relatively inert undoped substrate material 101 may include monocrystalline silicon (monosilicon), polycrystalline silicon (polysilicon), and amorphous silicon, among other possibilities.

The first silicate material 103 may, in a number of embodiments, be formed from a number of possible oxides and/or silicates. For example, the first silicate material 103 may, in a number of embodiments, be formed from BPSG. The BPSG may include a silicon compound doped with various concentrations and/or ratios of a boron compound and a phosphorus compound. The silicon compound may be silicon dioxide ($SiO_2$), which may be formed by oxidation of silane ($SiH_4$), among other possibilities. The boron compound may be diboron trioxide ($B_2O_3$), which may be formed by oxidation of diborane ($B_2H_6$), among other possibilities. The phosphorus compound may be diphosphorus pentoxide ($P_2O_5$), which may be formed by oxidation of phosphine ($PH_3$), among other possibilities. The silicon, boron, and phosphorus compounds of the BPSG may include various isotopes of silicon, boron, and phosphorus, as determined to be appropriate for functionality, formation, and/or removal of the first silicate material 103, as described herein. Alternatively, the first silicate material 103 may, in a number of embodiments, be formed from TEOS. TEOS may be formed as an ethyl ester of orthosilicic acid ($Si(OH)_4$), among other possibilities.

The first silicate material 103 may be originally formed (e.g., deposited) as a continuous, or first continuous, layer (e.g., a layer in one deposition or processing sequence on a surface 110 of the underlying substrate material 101). For example, the first silicate material 103 may be formed without an opening formed therein from an upper surface of the first silicate material 103 to the surface 110 of the underlying substrate material 101. The layer of the first silicate material 103 may, in a number of embodiments, be deposited to a thickness (e.g., height) in a range of from around 400 nanometers (nm) to around 800 nm above the surface 110 of the underlying substrate material 101. Embodiments, however, are not limited to these examples.

Within the plurality of pillars 102, a nitride material 105 is shown to be formed over a surface of the first silicate material 103 opposite from the underlying substrate material 101. The nitride material 105 may be formed (e.g., deposited) as a continuous, or second continuous, layer (e.g., a layer in one deposition or processing sequence on an upper surface of the first silicate material 103). Alternatively, the nitride material 105 may be formed (e.g., deposited) as three separate portions (e.g., layers) on the upper surfaces of the first silicate material 103. For example, the first silicate material 103 may be formed with a number of openings between the pillars 102. Such openings are illustrated in FIG. 1 as portions of openings 108-1 and 108-2 between pillars 102-1 and 102-2 and between pillars 102-2 and 102-N, respectively (hereinafter referred to collectively as plurality of openings 108). The plurality of pillars 102 are illustrated as pillars in this 2-dimensional (2D) format but are not necessarily pillars in a 3D format. For example, the pillars 102 may represent walls of circular openings or walls of a rectilinear trench in a 3D configuration.

The nitride material 105 described herein may be formed from a nitride material selected for dielectric or resistance properties. For example, one or more dielectric and/or resistor nitrides may be selected from boron nitride (BN), silicon nitride ($SiN_X$, $Si_3N_4$), aluminum nitride (AlN), gallium nitride (GN), tantalum nitride (TaN, $Ta_2N$), titanium nitride (TiN, $Ti_2N$), and tungsten nitride (WN, $W_2N$, $WN_2$), among other possibilities, for formation of the nitride material 105. The nitride material 105 may, in a number of embodiments described elsewhere herein, be deposited to a height in a range of from around 5 nm to around 15 nm or in a range of from 20 nm to 50 nm above the surface of the first silicate material 103, among other possible heights.

A second silicate material 106 is shown to be formed over a surface of the nitride material 105 opposite from the first silicate material 103. The second silicate material 106 may be formed (e.g., deposited) as a continuous, or third continuous, layer (e.g., a layer in one deposition or processing sequence on an upper surface of the nitride material 105). The second silicate material 106 may, in a number of embodiments, be formed from a number of possible oxides and/or silicates. For example, the second silicate material 106 may be formed from BPSG or TEOS, among other possible oxides and/or silicates. The second silicate material 106 may be formed from the same oxide and/or silicate as used to form the first silicate material 103.

An etch process (e.g., a wet etch process or dry etch process) may, in a number of embodiments, be utilized to etch into (e.g., through) the second silicate material 106, the nitride material 105, and/or the first silicate material 103 to form a plurality of openings 108 within these materials, as is illustrated between the plurality of pillars 102. Performance of the etch process may result in formation of the openings 108 within and between various combinations of the pillars 102. The resultant openings 108 may extend from the upper surface of the second silicate material 106 to the surface 110 of the substrate material 101. The resultant openings 108 may have a height 118 in a range of from around 800 nm to around 1,500 nm, which may correspond to an overall height of the structure. Each of the materials used to form the pillars 102 may contribute a particular height to the overall height 118 of the structure. For example, the first silicate material 103 may have a height 114, the nitride material 105 may have a height 116, and the second silicate material 106 may have a height 117 that, when added together, result in the overall height 118. In a number of embodiments, a width or diameter of the openings 108 between the pillars 102 may be within a range of from around 20 to around 60 nm.

Figure 2:
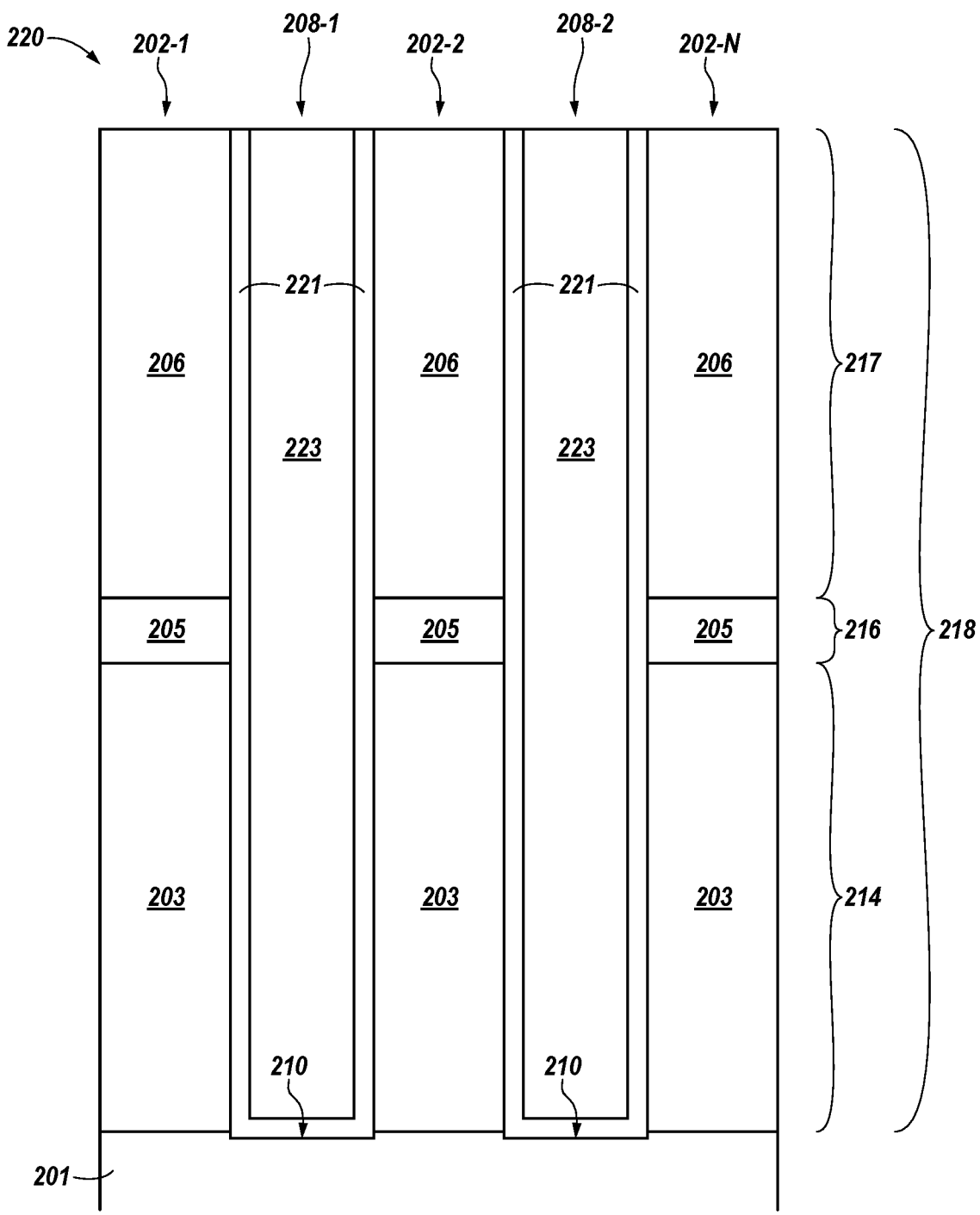

FIG. 2 illustrates a cross-sectional view of the portion of the example memory device at another point 220 in time in the example fabrication sequence for a capacitor support structure described in connection with FIG. 1 in accordance with a number of embodiments of the present disclosure. FIG. 2 illustrates a structure of the portion of the example memory device at a point 220 in time following completion of the fabrication sequence described in connection with FIG. 1.

As described in connection with FIG. 1, a nitride material 205 may be formed (e.g., deposited) between the first silicate material 203 and the second silicate material 206. A plurality of openings 208 between pillars 202 may extend from the substrate material 201 to a top of the second silicate material 206. For clarity in the example fabrication sequence, FIG. 2 shows a first opening 208-1 and a second opening 208-2 in the portion of the example memory device, although embodiments are not limited to two openings and may include any number of such openings.

As shown in FIG. 2, subsequent to formation of the openings 208, a first electrode material 221 may be formed (e.g., deposited) over (e.g., on) the surface 210 of the substrate material 201 and over (e.g., on) the sidewalls of the openings 208. In a number of embodiments, the first electrode material 221 also may have been formed over an upper surface of the second silicate material 206. A chemical mechanical planarization (CMP) process may be used to planarize and reduce a portion of the first electrode material 221 on the upper surface of the second silicate material 206 to a height of the openings 208 and/or the upper surface of the second silicate material 206.

A column of a capacitor material 223 is shown as having been formed (e.g., deposited) to fill the openings 208 from the substrate material 201 to a height 218 of the openings 208 at the upper surface of the second silicate material 206. As such, a height of the column of capacitor material 223 may correspond to the height of the pillars 102 that contribute the overall height 118 of the structure described in connection with FIG. 1. For example, the height of the capacitor material 223 may correspond to a total of the height 214 of the first silicate material 203, the height 216 of the nitride material 205, and the height 217 of the second silicate material 206.

Hence, the height of the column of capacitor material 223 may be in a range of from around 800 nm to around 1,500 nm. Because the capacitor material 223 fills the width or diameter of the openings 208 between the pillars 202, the width or diameter of the capacitor material 223 may be within a range of from around 20 to around 60 nm (e.g., minus a thickness of the first electrode material 221 on each side of the opening 208). Accordingly, the capacitor material 223 may have an AR of the height to width being in a range of from around 25:1 to around 50:1.

In a number of embodiments, the capacitor material 223 may be deposited to fill the openings 208 to an upper surface of the first electrode material 221 (represented by height 218). The first electrode material 221 and the capacitor material 223 may be formed from various conductive materials and to various thicknesses (e.g., heights and widths) as suited to a particular design rule for the formation of an operable capacitor for a semiconductor device.

Figure 3:
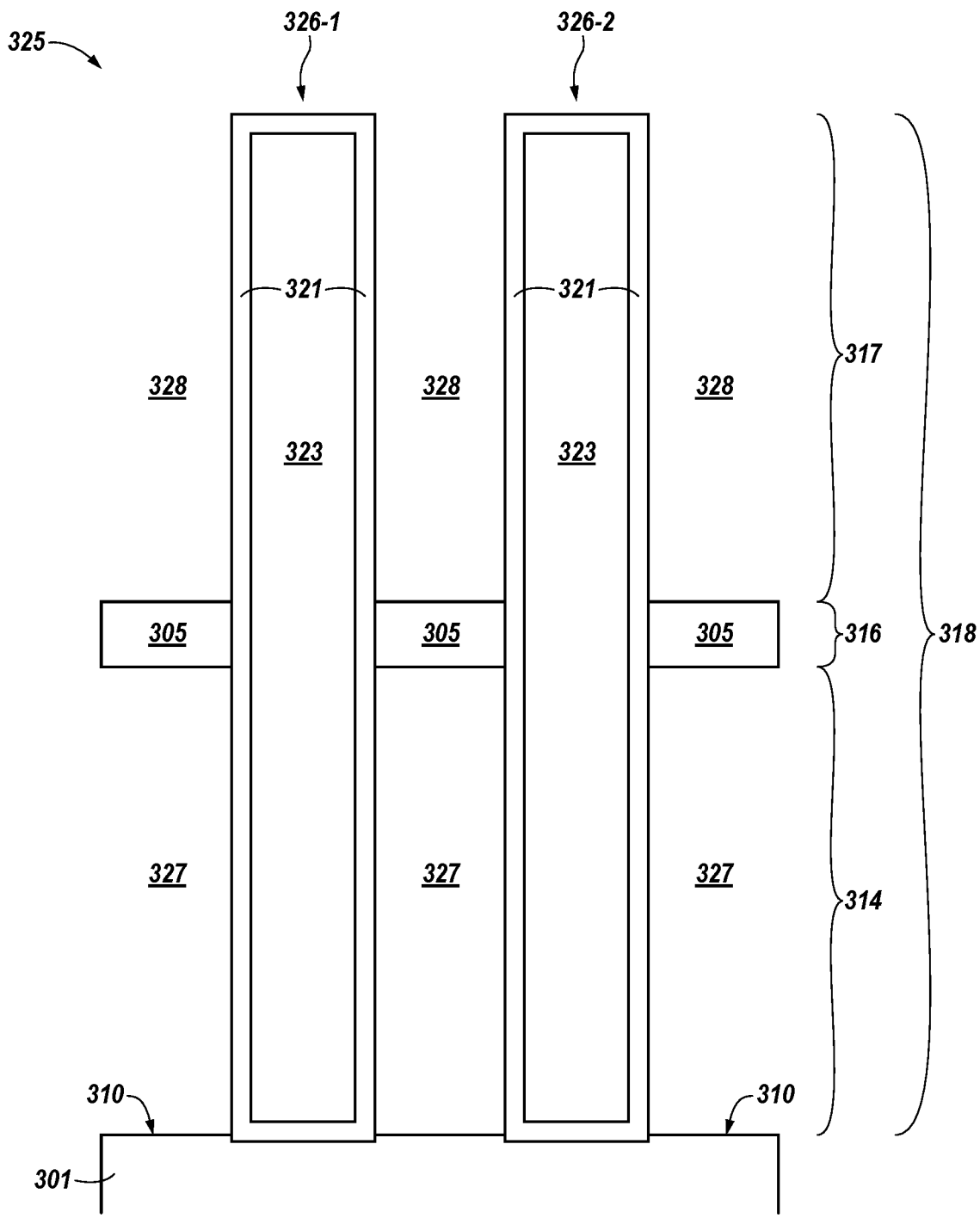

FIG. 3 illustrates a cross-sectional view of the portion of the example memory device at another point 325 in time in the example fabrication sequence for a capacitor support structure described in connection with FIGS. 1-2 in accordance with a number of embodiments of the present disclosure. FIG. 3 illustrates a structure of the portion of the example memory device at a point 325 in time following completion of the fabrication sequence described in connection with FIGS. 1-2.

The first silicate material shown at 203 in FIG. 2 and the second silicate material shown at 206 in FIG. 2 (e.g., each of which may be BPSG, TEOS, among other possibilities) are removed from the portion of the example memory device. The first silicate material 203 and the second silicate material 206 may be removed with (via application of) a solvent that is selective for removing (e.g., dissolving) the first and second silicate materials from the memory device, while not removing (e.g., leaving) other materials such that those materials remain in the memory device. Such a selective solvent may be selected from water ($H_2O$), methanol ($CH_3OH$), ethanol ($C_2H_5OH$), isomers of propanol ($C_3H_7OH$) such as n-propanol and isopropanol, n-butanol ($C_4H_9OH$), among other possible alcohols, and sulfuric acid ($H_2SO_4$), and combinations thereof, among other possibilities. Alternatively or in addition, the first silicate material 203 and the second silicate material 206 may have been removed using a selective etch process (e.g., a wet etch process).

Removal of the first silicate material 203 and the second silicate material 206 may leave empty spaces (e.g., voids) in the structure of the memory device. Examples of such voids are shown in FIG. 3 at 327 adjacent the portions of the capacitors 326-1 and 326-2 formed from the capacitor material 323 and the first electrode material 321 that are below the nitride material 305 of the support structure and as shown at 328 above the nitride material 305 of the support structure. The height 314 of void 327 may correspond to the height 214 of the removed first silicate material 203 and the height 317 of void 328 may correspond to the height 217 of the removed second silicate material 206.

In contrast, the application of the selective solvent may leave the capacitor material 323, having the first electrode material 321 formed over an outer surface thereof, remaining in the structure of the memory device. In addition, the nitride material 305 may be left remaining following the application of the selective solvent, among other possible components or structural features that may remain in the structure of the memory device. The remaining nitride material 305 may function as a capacitor support structure, as described further in connection with FIGS. 4 and 5, to provide support in view of the voids 327, 328 in the structure of the memory device during the fabrication process.

During at least one of the stages described in association with FIGS. 2-3, a portion of the capacitor material 323, along with the first electrode material 321 on an upper surface of the second silicate material 206, may have been removed (e.g., by being etched or by CMP). More of the first electrode material 321 may have been formed (e.g., deposited) on upper surfaces of remaining portions of the capacitor material 323, such that the capacitor material 323 is covered on all surfaces with the first electrode material 321. An upper surface of the first electrode material 321 may, in a number of embodiments, be coplanar with the upper surface of the second silicate material 206 such that a height 318 of the capacitor material 323 covered by the first electrode material 321 may be the same as the height of the original opening 118.

Figure 4:
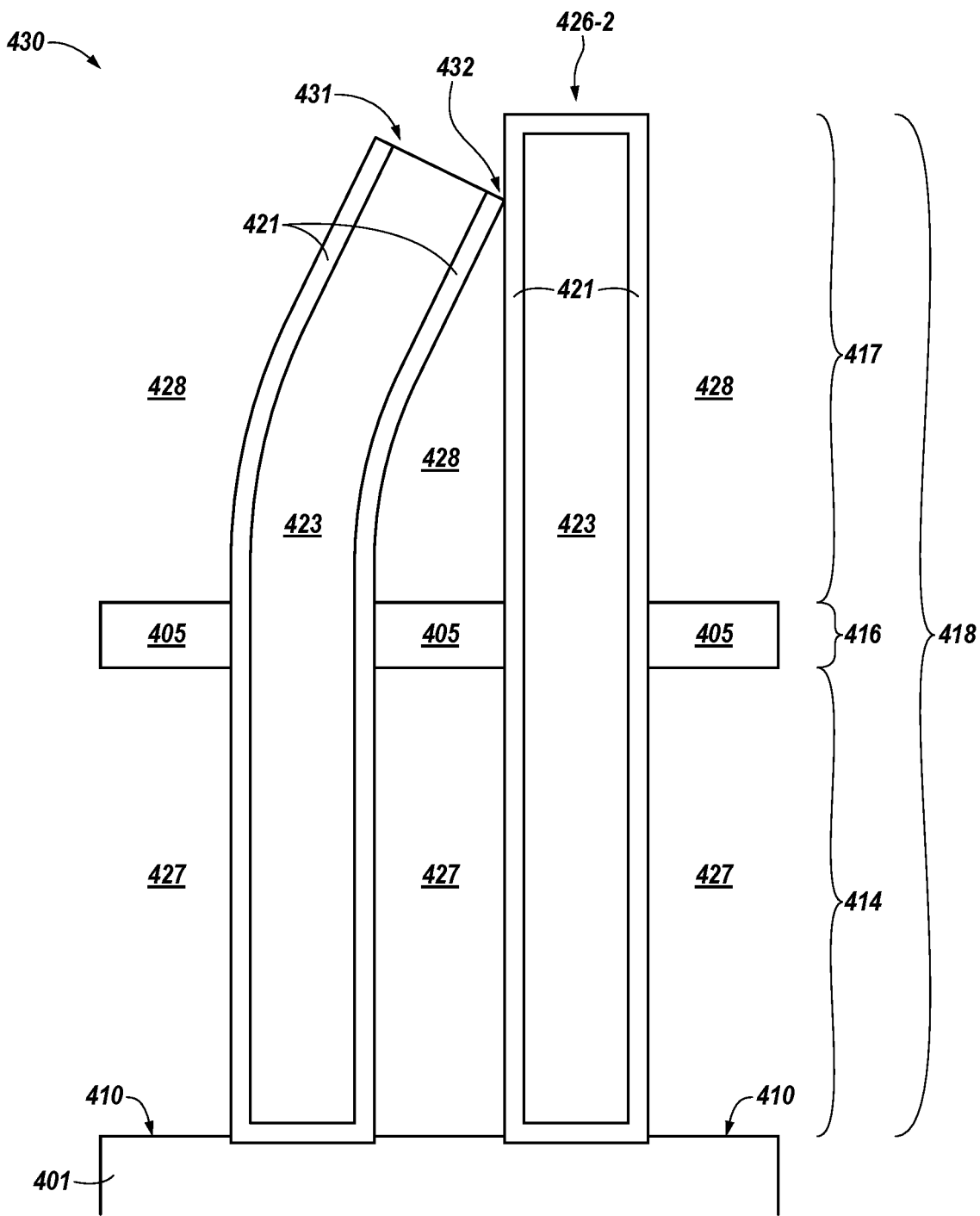

FIG. 4 illustrates a cross-sectional view of the portion of the example memory device at another point 430 in time in the example fabrication sequence for a capacitor support structure described in connection with FIGS. 1-3 in accordance with a number of embodiments of the present disclosure. FIG. 4 illustrates a structure of the portion of the example memory device at a potential point 430 in time following completion of the fabrication sequence described in connection with FIGS. 1-3, although without completion of the portion of the fabrication sequence described in connection with FIG. 5.

Application of the selective solvent and/or etch process described in connection with FIG. 3 may leave the capacitor material 423 having the first electrode material 421 formed over an outer surface thereof remaining in the structure of the memory device. In addition, the nitride material 405 may be left remaining following the application of the selective solvent and/or etch process as a single support structure connected at mid-height to the capacitor material 423 and/or the first electrode material 421, among other possible components or structural features that may remain in the structure of the memory device. Hence, voids 427 may have a bottom surface 410 of the underlying substrate material 401 and a top that includes the nitride material 405 as the single support structure. In contrast, voids 428 may have a bottom that includes the nitride material 405 as the single support structure and no additional support structure between the nitride material 405 and the top of the capacitor material 423 and/or the first electrode material 421.

As the height 318 of the portions of the capacitors 326 described in connection with FIG. 3 increases, wobbling, bending, and/or twisting of the capacitors 326 may occur. In some fabrication sequences, such wobbling, bending, and/or twisting of the capacitors 326 may be associated with, or occur during, drying of the capacitors 326 and/or the support structure. The nitride material 405 being formed as the only support structure below the voids 428 may contribute to a surface tension force causing the wobbling, etc., during drying. However, supercritical drying may be performed after removal of the first silicate material 203 and the second silicate material 206 to reduce (e.g., prevent) the wobbling, etc., as further described in connection with FIG. 5.

FIG. 4 shows a portion of a capacitor 431 that has, for example, wobbled into void 428 in the absence of an upper support structure and without supercritical drying being performed on the portion of a capacitor 431. The portion of the capacitor 431 that has wobbled is shown to have extended across the void 428 to form an unintended electrical connection 432 (e.g., that may contribute to a short circuit fault) with a neighboring portion of a capacitor 426-2. For simplicity, the portion of the capacitor 426-2 is shown as not having wobbled (e.g., as being upright as shown for the portions of the capacitors at 326-1 and 326-2 in FIG. 3), although portions of both of the capacitors 431 and 426-2 may have wobbled, bent, and/or twisted to form the unintended electrical connection 432 in the void 428.

Figure 5:
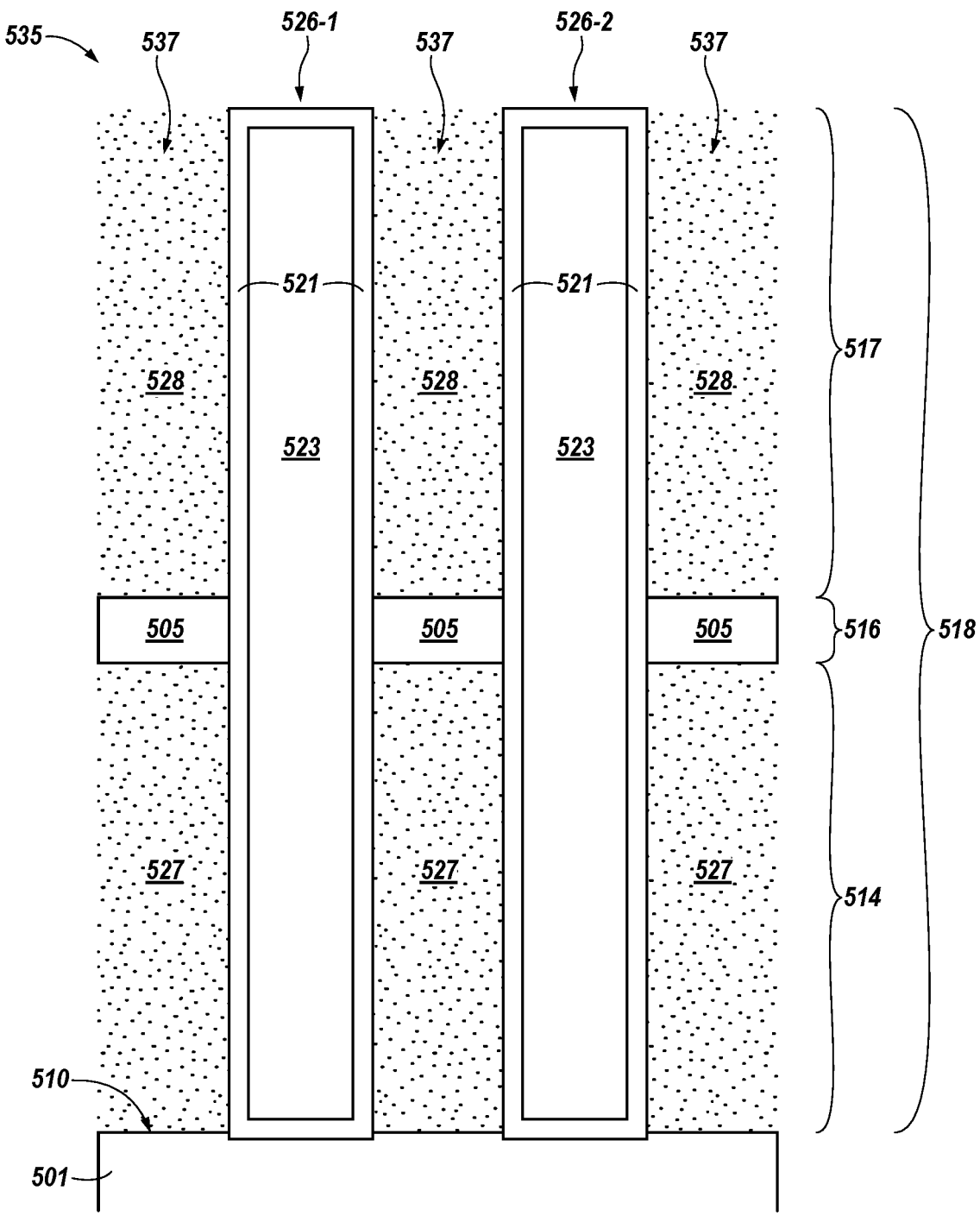

FIG. 5 illustrates a cross-sectional view of the portion of the example memory device at another point 535 in time in the example fabrication sequence for a capacitor support structure described in connection with FIGS. 1-3 in accordance with a number of embodiments of the present disclosure. FIG. 5 illustrates a structure of the portion of the example memory device at point 535 in time following completion of the fabrication sequence described in connection with FIGS. 1-3 and without the portion of the fabrication sequence described in connection with FIG. 4.

FIG. 5 illustrates the portion of the example memory device at point 535 in time after removal of the first silicate material 203 and the second silicate material 206 shown and described in connection with FIG. 2, which may correspond to being soon (e.g., immediately) after the point 325 in time shown and described in connection with FIG. 3. At point 525, a supercritical compound 537 (e.g., $CO_2$, $N_2O$, and/or $H_2O$, among other possible supercritical compounds) is shown as being used to fill the voids 527, 528 between and surrounding the upright portions of the capacitors 526-1, 526-2. Using the supercritical compound 537 as such may enable supercritical drying of the capacitor material 523 and the first electrode material 521 of the upright portions of the capacitors 526-1, 526-2 to reduce (e.g., prevent) the probability for wobbling, etc., in order to enable the capacitors 526 to remain upright. The capacitors 526 remaining upright, as a result of reduction of the surface tension force, may reduce (e.g., prevent) a probability for formation of a number of short circuit faults between the capacitors 526. The supercritical compound 537 also may, in a number of embodiments, be used for supercritical drying the nitride material 505 of the support structure and other possible components or structural features that may remain in the structure of the memory device.

The supercritical drying may, in a number of embodiments, be performed using $CO_2$ as the supercritical compound 537. Supercritical drying using $CO_2$ may be performed at a temperature in a range of from around 20 degrees Celsius (° C.) to around 100° C., at a pressure in a range of from around 5 megapascals (MPa) to around 60 MPa, and/or for a time period in a range of from around 60 seconds to around 300 seconds.

Tests were performed to compare supercritical drying using $CO_2$ relative to otherwise drying of a column of the capacitor material 523 (e.g., and the first electrode material 521) after the removal of the first and second silicate materials 203, 206. For example, using isopropyl alcohol to dry the column after removal of the first and second silicate materials, along with using a support structure connected both at mid-height and the top of the column, was compared to using the $CO_2$ supercritical drying and the single mid-height support structure described herein. Microscopic examination from above a top of wafers having hundreds of the columns formed thereon shows that displacement (e.g., wobbling, etc.) of the columns when using the $CO_2$ supercritical drying is less than 1% of the displacement observed when using the isopropyl alcohol to dry the column. Notably, using no support structure at either the mid-height or the top of the column along with using the $CO_2$ supercritical drying also may result in a displacement that is less than 1% of the displacement when using the isopropyl alcohol to dry the column.

A process of supercritical drying may be performed in a processing chamber 1182 of a processing apparatus 1181, as shown and described in connection with FIG. 11. The process of supercritical drying may, in a number of embodiments, be performed in a same chamber 1182 of the processing apparatus 1181 as is used for performance of other portions of the fabrication sequence (e.g., deposition and/or removal by etching of the silicate materials 203, 206, the nitride material 505, the capacitor material 523, the first electrode material 521, etc.) or the process of supercritical drying may be performed in a different chamber 1182.

The nitride material 505 may form the single support structure by extending between and connecting (e.g., attaching) to features associated with multiple capacitors (e.g., as shown and described in connection with FIGS. 5-7) or other structural elements of the example memory device. A single support structure formed as such may reduce an amount of surface area of a capacitor occupied for connection to the support structure, thereby increasing an amount of exposed surface area for the capacitor. Hence, using the nitride material 505 as the single support structure may increase the capacitance of each of the capacitors of the example memory device.

Figure 6:
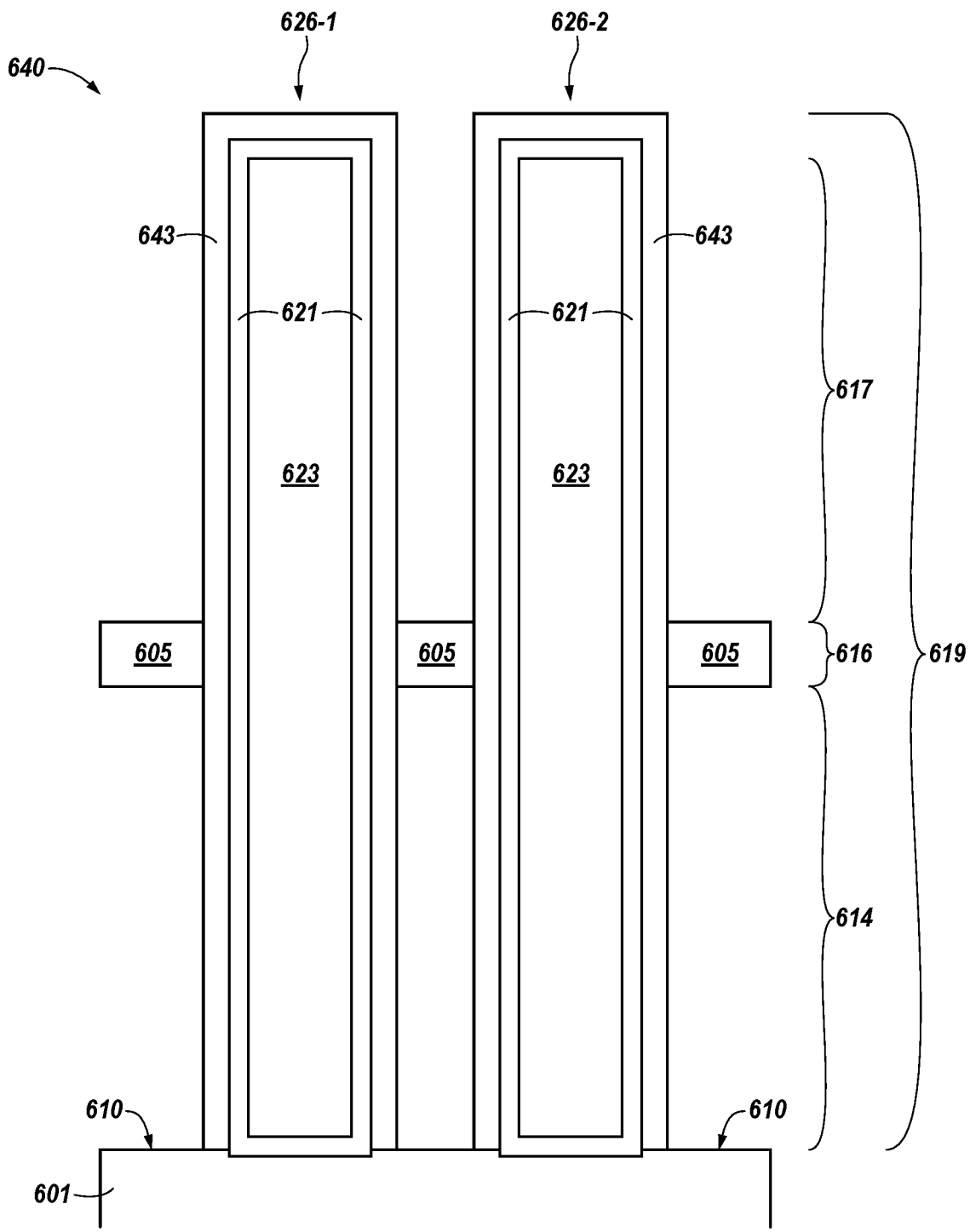

FIG. 6 illustrates a cross-sectional view of the portion of the example memory device at another point 640 in time in the example fabrication sequence for a capacitor support structure described in connection with FIGS. 1-3 and 5 in accordance with a number of embodiments of the present disclosure. FIG. 6 illustrates a structure of the portion of the example memory device at point 640 in time following completion of the fabrication sequence described in connection with FIGS. 1-3 and 5.

As shown in FIG. 6, a dielectric material 643 has been formed (e.g., deposited) over (e.g., on) an outer surface of the first electrode material 621 on the portions of the capacitors 626-1, 626-2. The dielectric material 643 may, in a number of embodiments, be formed from a surface 610 of the substrate material 601 to cover the outer surface, including an upper surface, of the first electrode material 621. A height 619 of the portions of the capacitors 626 may include the height 318 of the portions of the capacitors 326 described in connection with FIG. 3 plus additional height of the dielectric material 643 formed thereon.

Figure 7:
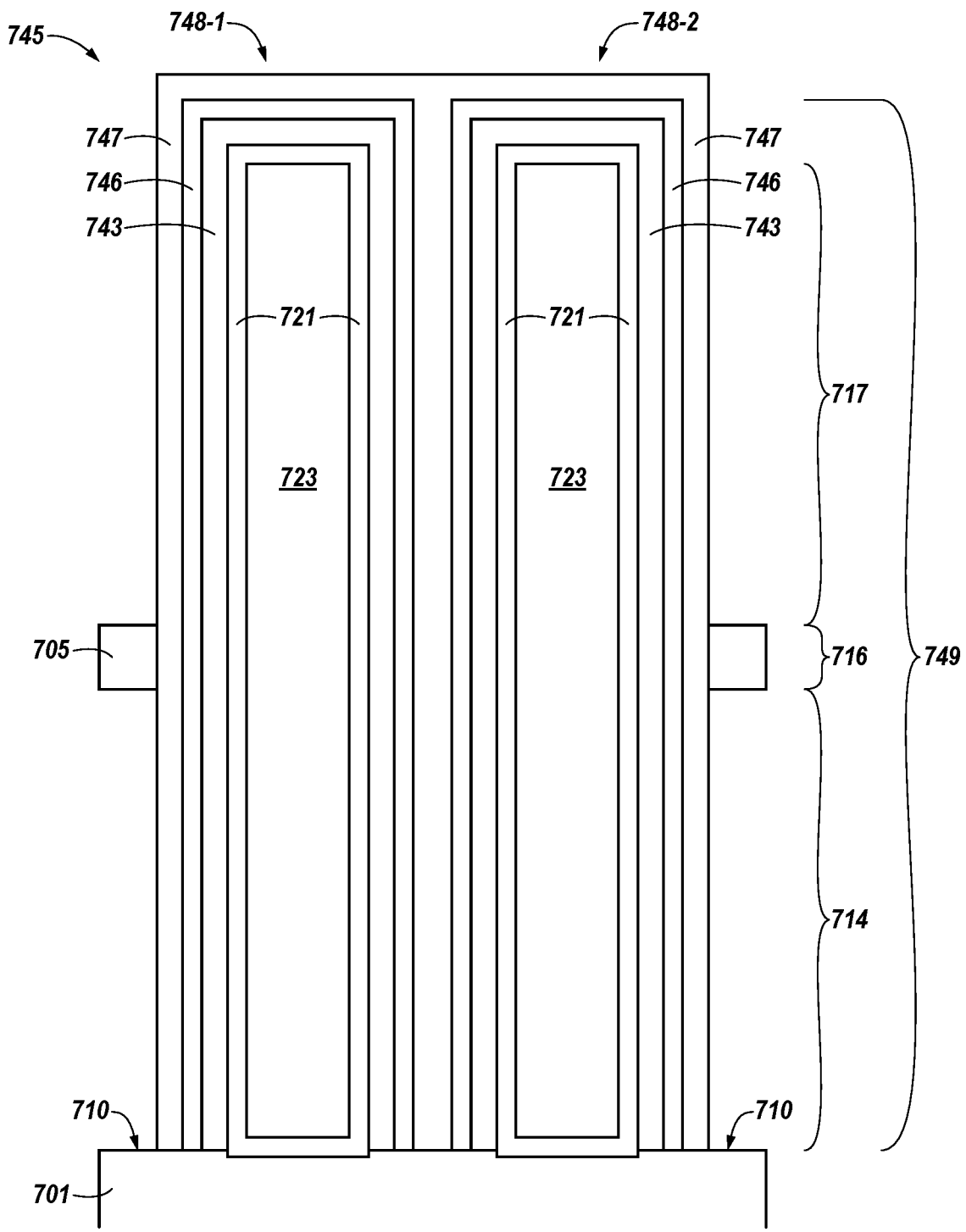

FIG. 7 illustrates a cross-sectional view of the portion of the example memory device at another point 745 in time in the example fabrication sequence for a capacitor support structure described in connection with FIGS. 1-3 and 5-6 in accordance with a number of embodiments of the present disclosure. FIG. 7 illustrates a structure of the portion of the example memory device at point 745 in time following completion of the fabrication sequence described in connection with FIGS. 1-3 and 5-6.

FIG. 7 shows that, for example, two completed capacitors 748-1 and 748-2 may be formed by a second electrode material 746 being formed (e.g., deposited) over (e.g., on) an outer surface of the dielectric material 746. As illustrated in FIG. 7, a height 749 of the capacitors 748 may include the height 318 of the portions of the capacitors 326 described in connection with FIG. 3, the height of the dielectric material 743 described in connection with FIG. 6, plus additional height of the second electrode material 746 formed thereon. The height 749 of the capacitors 748 may be higher than the height 118 of the original opening 108 due to the dielectric material 743 and second electrode material 746 being formed over the first electrode material 721. The portion of the example memory device illustrated in FIG. 7 shows the first capacitor 748-1 and the second capacitor 748-2 indicated as widths in the structure formed as just described.

The example memory device illustrated in FIG. 7 shows a buffer material 747 that may be formed around and between the first and second capacitors 748-1, 748-2 as electrical insulation. The capacitor material 723, the first electrode material 721, the dielectric material 743, the second electrode material 746, and the buffer material 747 each may be formed from various respective dielectric materials, conductive materials, and resistive materials and to various thicknesses (e.g., widths or heights) as suited to a particular design rule (CD) for formation of an operable capacitor for a semiconductor device.

The support structure is formed from the nitride material 705, in addition to the underlying substrate material 701. The support structure may provide support to the first and second capacitors 748-1, 748-2 after the removal of the first and second silicate materials 203, 206 has left voids 527, 528 in the structure of the memory device during the fabrication process and even after such voids may have been at least partially filled by the buffer material 747. The support structure formed from the nitride material 705 is shown, for ease of illustration in what may be a 3D cross sectional view, to be connected (e.g., attached) to the left side of the first electrode material 721 for capacitor 748-1 and the right side of the first electrode material 721 for capacitor 748-2. However, the support structure formed from the nitride material 705 also may be on the opposite sides, or may be attached at four positions or even surround, the first and second capacitors 748-1, 748-2. In a number of embodiments, the dielectric material 743, the second electrode material 746, and/or the buffer material 747 may surround the first electrode material 721 of the capacitors 748-1, 748-2 except at defined positions where the nitride material 705 of the single support structure is attached to the first electrode material 721.

Formation of the capacitors and a capacitor support structure as just described may enable each of the capacitors to be maintained in a static configuration (e.g., relative to each other and the underlying material). For example, the capacitor support structure may reduce (e.g., prevent) a risk (e.g., probability) of a capacitor wobbling, bending, and/or twisting during fabrication or during use. Further, the reduction in wobbling, etc., of the capacitors may reduce a possibility of unintended consequences, such as operational failure of the semiconductor device due, for example, to short circuit faults of the capacitors, need to replace parts, etc.

Formation of the capacitors and capacitor support structure as just described may be utilized in fabrication of a memory device that includes at least one memory cell. Such a memory cell may include at least one such capacitor, as a data storage node, that is supported by the capacitor support structure. The memory cell also may include at least one access device (e.g., transistor) (not shown) that is, or may be, coupled to the at least one capacitor. The formed capacitor 748 of the memory cell may provide additional capacitance due to an increased exposed surface area of the capacitor, as described in association with FIGS. 1-6 herein. In some embodiments, the capacitance of the capacitor 748 may provide between 5.0 femtofarads of capacitance per memory cell (fF/cell) and 8.0 fF/cell. The capacitance of each capacitor 748 may be increased corresponding to reduction of a height (e.g., thickness) of the nitride material 705 of the single support structure.

By way of example and not by way of limitation, a height of the nitride material 705 of the single support structure that ranges from 50 nm to 20 nm may correspond to an increasing capacitance in a range of 5.5 fF/cell to 6.5 fF/cell and a height that ranges from 15 nm to 5 nm may correspond to an increasing capacitance in a range of 7.0 fF/cell to 8.0 fF/cell. As such, the height of the nitride material 705 may be varied in order to reach particular threshold capacitances while maintaining a balance between height of the capacitor material 723, height of the nitride material 705, and an amount of wobbling, bending, and/or twisting that may occur at a particular height and/or AR of the capacitor 748.

Figure 8:
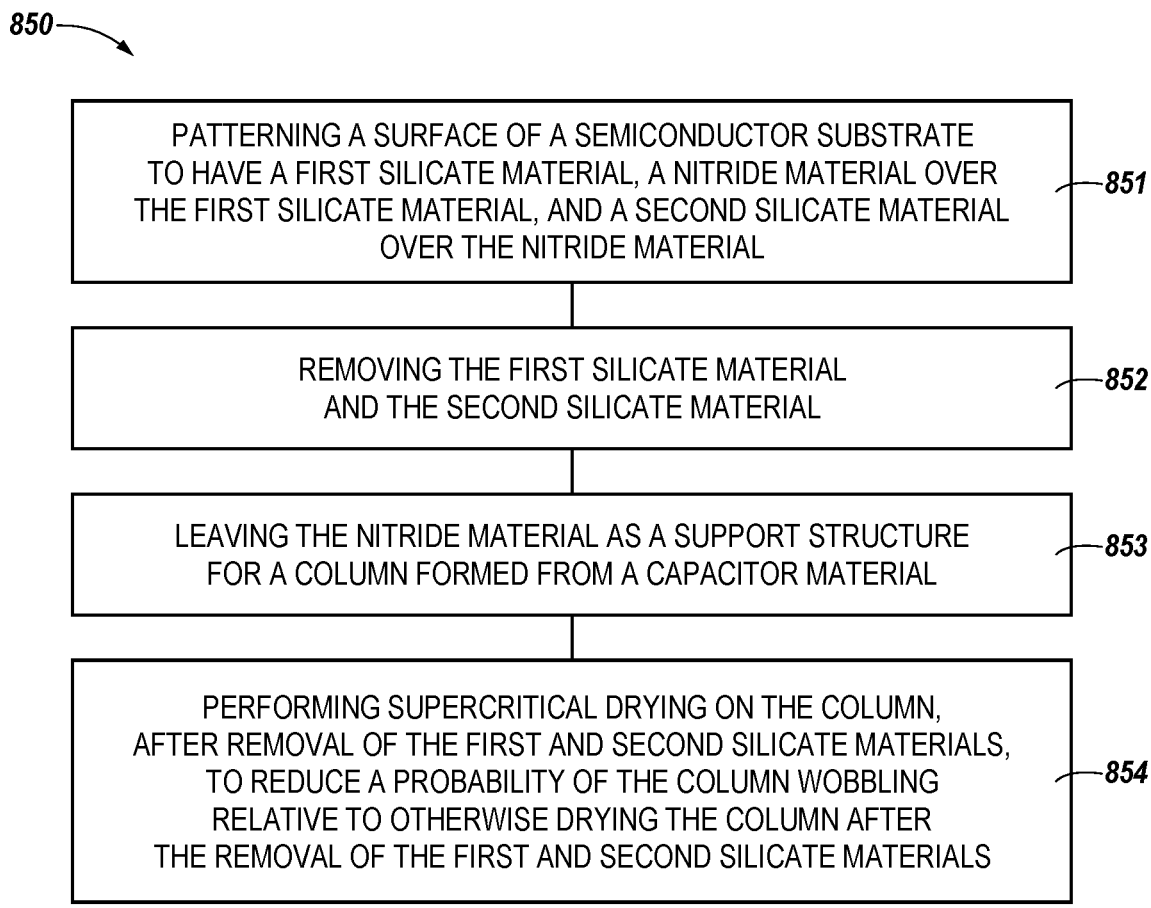

FIG. 8 is a flow diagram of an example method 850 for formation of a capacitor support structure in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 851, the method 850 may include patterning a surface of a semiconductor substrate to have a first silicate material, a nitride material over the first silicate material, and a second silicate material over the nitride material (e.g., as described in connection with FIGS. 1 and 2). At block 852, the method 850 may include removing the first silicate material and the second silicate material (e.g., as described in connection with FIG. 3). At block 853, the method 850 may include leaving the nitride material as a support structure for a column formed from a capacitor material (e.g., as described in connection with FIGS. 3 and 4). At block 854, the method 850 may include performing supercritical drying on the column, after removal of the first and second silicate materials, to reduce a probability of the column wobbling, etc., relative to otherwise drying the column after the removal of the first and second silicate materials (e.g., as described in connection with FIGS. 4 and 5). An example of otherwise drying the column is using isopropyl alcohol to dry the column after removal of the first and second silicate materials (e.g., as described in connection with FIG. 5).

The method 850 may, in a number of embodiments, further include forming the capacitor material in an opening through the first silicate material, the nitride material, and the second silicate material (e.g., as described in connection with FIG. 2). The method 850 may further include positioning the support structure between the first and second silicate materials in a range of from around 40% to around 60% of a height of the column formed from the capacitor material and using the support structure as a single support for the column above the surface of the semiconductor substrate. The method 850 may further include forming the column to a height in a range of from around 800 nm to around 1,500 nm, forming the column to a width in a range of from around 20 nm to around 60 nm, and/or forming the column to have an AR of the height to width being in a range of from around 25:1 to around 50:1 (e.g., as described in connection with FIG. 2). The method 850 may further include forming the capacitor material to a particular height, a particular width, and/or a particular AR to conform to a particular CD suited for formation of an operable capacitor for a semiconductor device.

The method 850 may further include performing the supercritical drying using $CO_2$ at a temperature in a range of from around 20° C. to around 100° C., at a pressure in a range of from around 5 MPa to around 60 MPa, and/or for a time period in a range of from around 60 seconds to around 300 seconds (e.g., as described in connection with FIG. 5). Using supercritical drying, as described herein, may result in (e.g., cause) reduction (e.g., prevention) of wobbling, bending, and/or twisting of a column of capacitor material. The method 850 may further include reducing, by reduction of the wobbling, etc., a probability, during subsequent use of a memory device, of a short circuit fault of a capacitor formed from the capacitor material.

Figure 9:
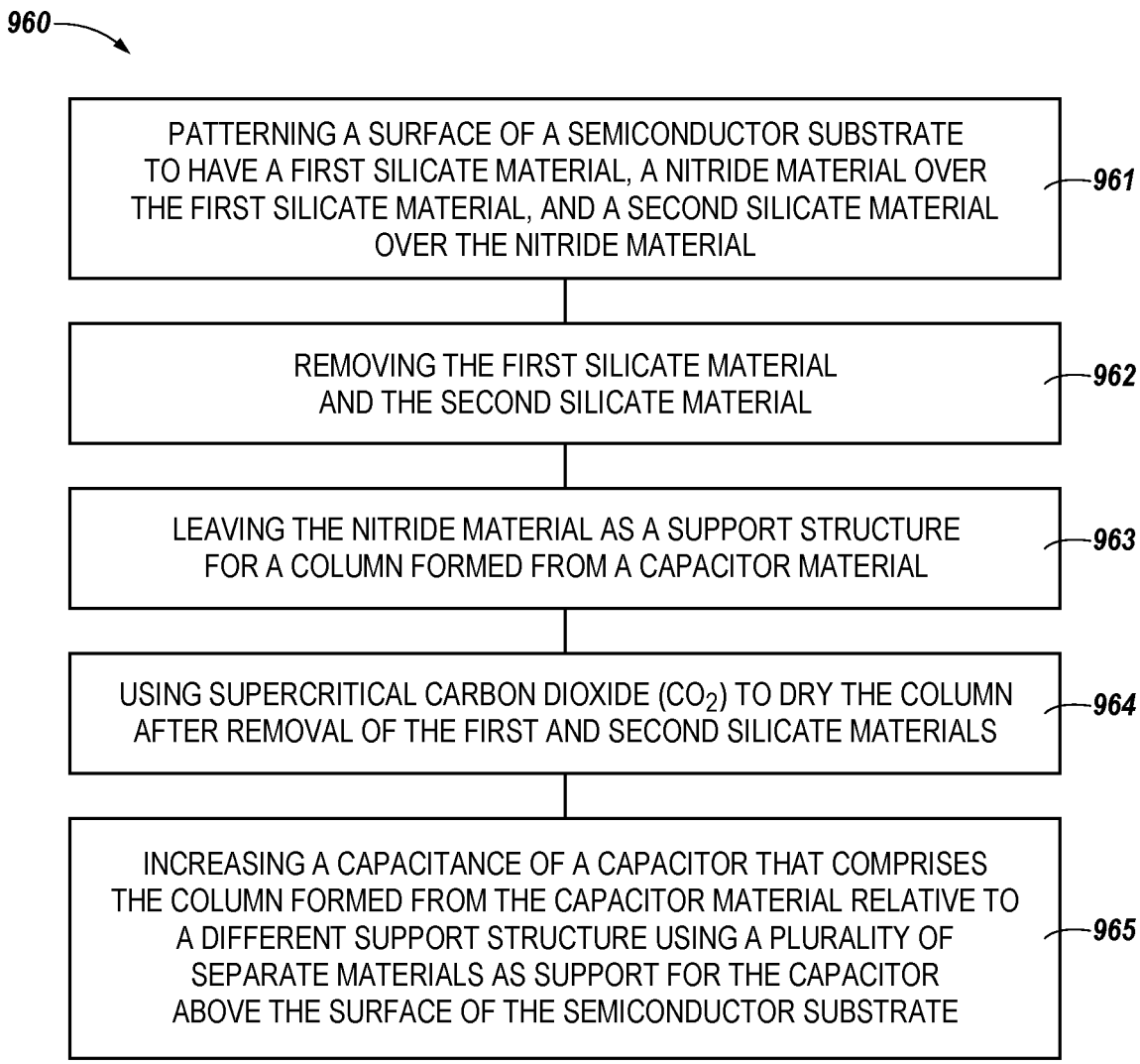

FIG. 9 is a flow diagram of another example method 960 for formation of a capacitor support structure in accordance with a number of embodiments of the present disclosure.

At block 961, the method 960 may include patterning a surface of a semiconductor substrate to have a first silicate material, a nitride material over the first silicate material, and a second silicate material over the nitride material (e.g., as described in connection with FIGS. 1 and 2). At block 962, the method 960 may include removing the first silicate material and the second silicate material (e.g., as described in connection with FIG. 3). At block 963, the method 960 may include leaving the nitride material as a support structure for a column formed from a capacitor material (e.g., as described in connection with FIGS. 3 and 4). At block 964, the method 960 may include using supercritical $CO_2$ to dry the column after removal of the first and second silicate materials (e.g., as described in connection with FIG. 5). At block 965, the method 960 may include increasing a capacitance of a capacitor that includes the column formed from the capacitor material relative to a different support structure using a plurality of separate materials as support for the capacitor above the surface of the semiconductor substrate (e.g., as described in connection with FIGS. 5 and 7).

The method 960 may, in a number of embodiments, further include increasing an exposed surface area of the capacitor to increase the capacitance by reduction of a total height of the support structure formed between the surface of the semiconductor substrate and a top of the capacitor (e.g., as described in connection with FIGS. 1-3, 5, and 7). The capacitance may be increased by maintaining a same height of a capacitor formed in the different support structure by reduction of a total height of the support structure. For example, using the single support structure at mid-height of the capacitor may reduce the total height relative to multiple portions of a support structure connected to the capacitor at a plurality of positions between the substrate material and the top of the capacitor.

The method 960 may further include patterning the surface of the semiconductor substrate such that a height of the nitride material used as the single support structure is in a range of from around 20 nm to around 50 nm. The method 960 may further include patterning the surface of the semiconductor substrate without another material formed as support for the column above the surface of the semiconductor substrate or associated with a top of the column.

The method 960 may further include patterning the surface of the semiconductor substrate such that a height of each of the first silicate material and the second silicate material is in a range of from around 400 nm to around 800 nm (e.g., as described in connection with FIGS. 1 and 2). The method 960 may further include patterning the surface of the semiconductor substrate by forming one of either the first silicate material and the second silicate material from one of a BPSG material and a TEOS material (e.g., as described in connection with FIGS. 1 and 2).

The method 960 may further include improving an ability to distinguish a potential first data value from a potential second data value stored by the capacitor (e.g., storage node) by enabling an improved ability to distinguish a low charge from a high charge associated with the first and second data values. For example, increasing a capacitance of a storage node may enable a wider separation in charge amplitude between a low charge representing a first data value (e.g., 0) and a high charge representing a second data value (e.g., 1). The wider separation in charge amplitudes may improve the improved ability to distinguish between the first and second data values.

The method 960 may further include, by increasing the capacitance, decreasing a frequency of a refresh operation performed on the capacitor relative to a capacitor of the same height used in the different support structure. For example, increasing the capacitance of the capacitor may increase a time period, given a particular charge drain rate, until the charge stored by the capacitor is reduced to a level that is associated with (e.g., causes) performance of a refresh operation to restore the charge of the capacitor.

FIG. 10 is a flow diagram of another example method 1070 for formation of a capacitor support structure in accordance with a number of embodiments of the present disclosure.

At block 1071, the method 1070 may include patterning a surface of a semiconductor substrate to have a first silicate material, a nitride material over the first silicate material, and a second silicate material over the nitride material (e.g., as described in connection with FIGS. 1 and 2). At block 1072, the method 1070 may include removing the first silicate material and the second silicate material (e.g., as described in connection with FIG. 3). At block 1073, the method 1070 may include leaving the nitride material as a support structure for a column formed from a capacitor material (e.g., as described in connection with FIGS. 3 and 4). At block 1074, the method 1070 may include reducing a surface tension force at a phase boundary by using supercritical $CO_2$ to dry the column after removal of the first and second silicate materials (e.g., as described in connection with FIGS. 3 and 5). At block 1075, the method 1070 may include, by reduction of the surface tension force during the drying, a probability of the column wobbling, bending, and/or twisting is reduced relative to otherwise drying the column. At block 1076, the method 1070 may include, by reduction of the probability of the column wobbling, etc., the nitride material is enabled to be the single support structure for the column.

The method 1070 may, in a number of embodiments, further include, by reduction of the probability of the column wobbling, etc., enabling reduction of a height of the nitride material used as the single support structure to be in a range of from around 5 nm to around 15 nm (e.g., as described in connection with FIGS. 1 and 7). The 5-15 nm range is relative to, when otherwise drying the column, a different support structure having either or both of a first nitride material over the first silicate material being in a range of from around 20 nm to around 50 nm and/or a second nitride material over the second silicate material, and associated with a top of the column, being in a range of from around 20 nm to around 150 nm. The method 1070 may, in a number of embodiments, further include, by use of the single support structure, increasing a capacitance of a capacitor that includes the column relative to a different support structure using a plurality of separate materials as support for the capacitor above the surface of the semiconductor substrate (e.g., as described in connection with FIGS. 5 and 7).

The method 1070 may further include, by the reduction of the probability of the column wobbling, etc., enabling an increased density of a plurality of capacitors formed over the semiconductor substrate. For example, the reduction of the probability of the column wobbling, etc., may reduce an associated risk (e.g., probability) of displacement of a number of the columns into the adjacent voids, which may result in an unintended electrical connection between the columns (e.g., as described in connection with FIG. 4). Reducing the probability of the wobbling, etc., and the resultant unintended electrical connections may enable the increased density of the capacitors formed on the semiconductor substrate. This may result in reducing, during subsequent use of a memory device, a probability of a short circuit fault of a capacitor at the increased density.

The method 1070 may further include patterning the surface of the semiconductor substrate further by removing, with a selective solvent, the first silicate material and the second silicate material and leaving the column formed from the capacitor material (e.g., as described in connection with FIG. 3). The method 1070 may further include leaving the column formed from the capacitor material having an electrode material formed over an outer surface thereof and leaving the nitride material as the support structure for a capacitor that includes the capacitor material and the electrode material (e.g., as described in connection with FIG. 3). The method 1070 may further include forming a number of electrode and dielectric materials over a surface of the column of the capacitor material (e.g., as described in connection with FIGS. 3 and 6-7). The method 1070 may further include using isopropyl alcohol to perform one or both of removal of residual material, resulting from processing the electrode and dielectric materials, and drying remaining electrode and dielectric materials formed over the surface of the column.

Figure 11:
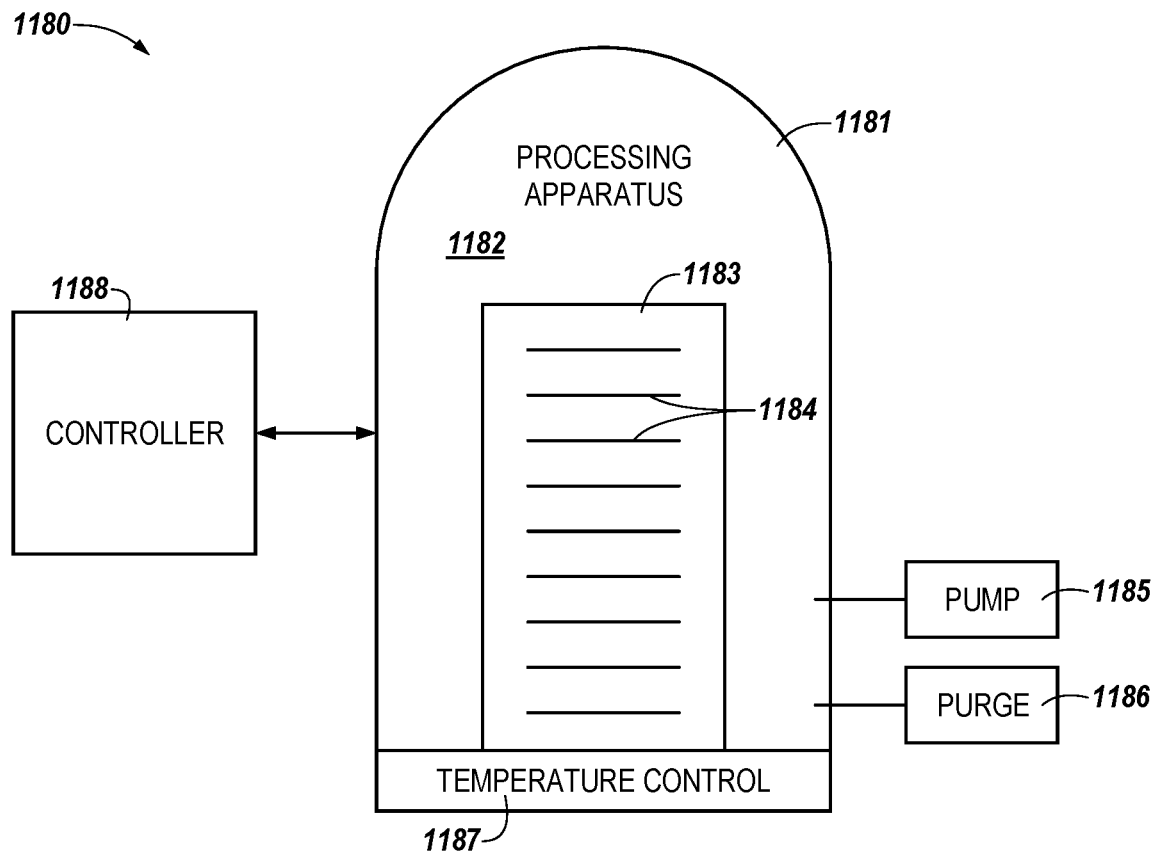
FIG. 11 is a functional block diagram of a system for implementation of an example semiconductor fabrication process in accordance with a number of embodiments of the present disclosure.

FIG. 11 is a functional block diagram of a system 1180 for implementation of an example semiconductor fabrication process in accordance with a number of embodiments of the present disclosure. The system 1180 may include a processing apparatus 1181. The processing apparatus 1181 may be configured to enable formation of structural materials on and/or removal of structural materials from a semiconductor device, among other operations, during fabrication of the semiconductor device.

The processing apparatus 1181 may include a chamber 1182 to enclose components configured to perform wet or dry deposition or etch operations, possibly in addition to other operations (e.g., supercritical drying operations, among others), on a number of semiconductor devices (e.g., wafers on which memory devices 1299, 1300 or arrays 1296 are being formed by the example semiconductor fabrication sequences described herein). The chamber 1182 may further enclose a carrier 1183 to hold a batch of semiconductor wafers 1184. The processing apparatus 1181 may include and/or be associated with tools including, for example, a pump 1185 unit and a purge 1186 unit configured to introduce and remove appropriate deposition chemistries and etch chemistries, or tools for performance of a supercritical drying process, as described herein, at each point in the semiconductor fabrication sequence. The processing apparatus 1181 may further include a temperature control 1187 unit configured to maintain the chamber 1182 at an appropriate temperature at each of the points in the fabrication sequences. For example, the temperature control 1187 unit may be configured to bring the chamber 1182 to a raised temperature appropriate for performance of some processes and to reduce the temperature as appropriate for performance of other process (e.g., dry or wet deposition, etching, supercritical drying, etc.). The system 1180 may include a number of chambers 1182 that are each configured to perform particular processes (e.g., a wet etch process, a dry etch process, a wet deposition process, a dry deposition process, a wet clean process, a dry clean process, a supercritical drying process, among others) during the fabrication sequence.

The system 1180 may further include a controller 1188. The controller 1188 may include, or be associated with, circuitry and/or programming for implementation of, for instance, formation and removal of materials, including deposition, etching, and/or supercritical drying of various materials, related to a capacitor support structure in a semiconductor device. Adjustment of such deposition, etching, and supercritical drying operations by the controller 1188 may control the CDs of the semiconductor devices created in the processing apparatus 1181.

A host may be configured to generate instructions related to formation of the capacitor support structure in a semiconductor device. An example of a host is shown at 1291 in FIG. 12, although embodiments are not limited to being coupled to the memory system 1293 shown in FIG. 12. The instructions may be sent via a host interface 1292 to the controller 1188 of the processing apparatus 1181. The instructions may be based at least in part on scaled preferences (e.g., in numerically and/or structurally defined gradients) stored by the host 1291, provided via input from another storage system (not shown), and/or provided via input from a user (e.g., a human operator), among other possibilities. The controller 1188 may be configured to enable input of the instructions and scaled preferences to define the CDs of the fabrication of the semiconductor device to be implemented by the processing apparatus 1181.

The scaled preferences may determine final structures (e.g., the CDs) of the structural materials, conductive materials, insulating materials, oxide materials, nitride materials, semiconductor materials, substrate materials, dielectric materials, capacitor materials, memory devices, and/or memory cells, among the various other structural features described herein. Particular CDs may be enabled by the particular scaled preferences that are input via the instructions. Receipt and implementation of the scaled preferences by the controller 1188 may result in corresponding adjustment, by the processing apparatus 1181, of a deposition time for various materials, adjustment of a coverage area, height, and/or volume of the various materials, adjustment of a trim direction and/or trim time performed on the various materials, adjustment of an etch direction, adjustment of an etch time performed on the various materials, and/or adjustment of the temperature, pressure, and/or length of time during the various processes (e.g., including the supercritical drying), among implementation of other possible scaled preferences.

The controller 1188 may, in a number of embodiments, be configured to use hardware as control circuitry. Such control circuitry may, for example, be an application specific integrated circuit (ASIC) with logic to control fabrication steps, via associated deposition, etch, and/or supercritical drying processes, related to capacitor support structures in a semiconductor device, along with formation of the various materials on and removal of the various materials from the semiconductor device.

The controller 1188 may be configured to receive the instructions and direct performance of operations, corresponding to the instructions, by the processing apparatus 1181. The controller 1188 may be configured to implement the instructions to control a quantity of the various materials that are formed on and removed from the semiconductor device.

Figure 12:
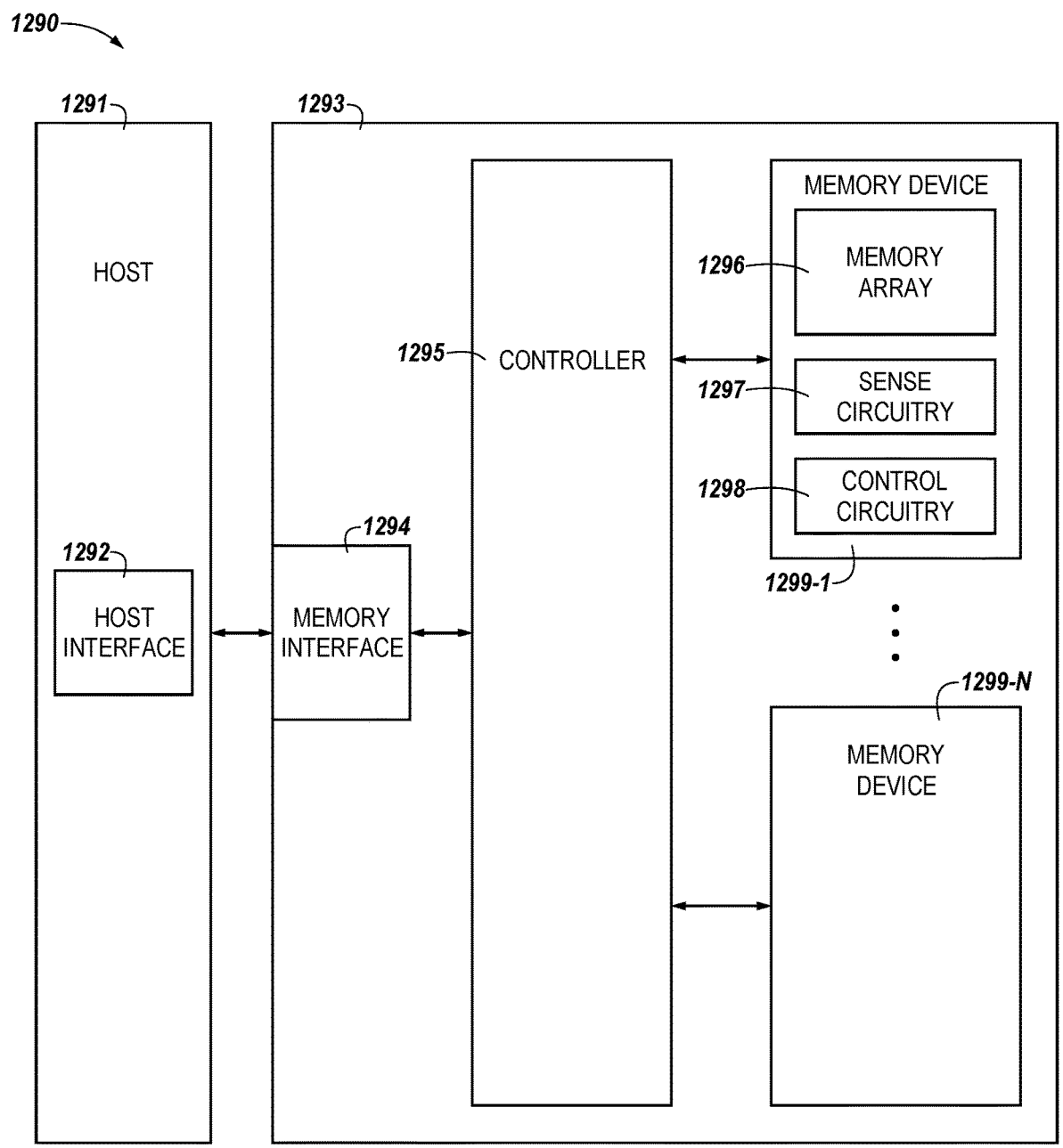
FIG. 12 is a functional block diagram of a computing system including at least one memory system in accordance with one or more embodiments of the present disclosure.

FIG. 12 is a functional block diagram of a computing system 1290 including at least one memory system 1293 in accordance with one or more embodiments of the present disclosure. Memory system 1293 may be, for example, a solid-state drive (SSD).

In the embodiment illustrated in FIG. 12, memory system 1293 includes a memory interface 1294, a number of memory devices 1299-1, . . . , 1299-N, and a controller 1295 selectably coupled to the memory interface 1294 and memory devices 1299-1, . . . , 1299-N. Memory interface 1294 may be used to communicate information between memory system 1293 and another device, such as a host 1291. Host 1291 may include a processor (not shown). As used herein, "a processor" may be a number of processors, such as a parallel processing system, a number of coprocessors, etc. Example hosts may include, or by implemented in, laptop computers, personal computers, digital cameras, digital recording devices and playback devices, mobile telephones, PDAs, memory card readers, interface hubs, and the like. Such a host 1291 may be associated with fabrication operations performed on semiconductor devices and/or SSDs.

In a number of embodiments, host 1291 may be associated with (e.g., include or be coupled to) a host interface 1292. The host interface 1292 may enable input of scaled preferences (e.g., in numerically and/or structurally defined gradients) to define, for example, CDs of a final structure or intermediary structures of a memory device (e.g., as shown at 1299) and/or an array of memory cells (e.g., as shown at 1296) formed thereon to be implemented by a processing apparatus. The scaled preferences may be provided to the host interface 1292 via input of a number of preferences stored by the host 1291, input of preferences from another storage system (not shown), and/or input of preferences by a user (e.g., a human operator).

Memory interface 1294 may be in the form of a standardized physical interface. For example, when memory system 1294 is used for information (e.g., data) storage in computing system 1290, memory interface 1294 may be a serial advanced technology attachment (SATA) interface, a peripheral component interconnect express (PCIe) interface, or a universal serial bus (USB) interface, among other physical connectors and/or interfaces. In general, however, memory interface 1294 may provide an interface for passing control, address, information, scaled preferences, and/or other signals between the controller 1295 of memory system 1293 and a host 1291 (e.g., via host interface 1292).

Controller 1295 may include, for example, firmware and/or control circuitry (e.g., hardware). Controller 1295 may be operably coupled to and/or included on the same physical device (e.g., a die) as one or more of the memory devices 1299-1, . . . , 1299-N. For example, controller 1295 may be, or may include, an ASIC as hardware operably coupled to circuitry (e.g., a printed circuit board) including memory interface 1294 and memory devices 1299-1, . . . , 1299-N. Alternatively, controller 1295 may be included on a separate physical device that is communicatively coupled to the physical device (e.g., the die) that includes one or more of the memory devices 1299-1, . . . , 1299-N.

Controller 1295 may communicate with memory devices 1299-1, . . . , 1299-N to direct operations to sense (e.g., read), program (e.g., write), and/or erase information, among other functions and/or operations for management of memory cells. Controller 1295 may have circuitry that may include a number of integrated circuits and/or discrete components. In a number of embodiments, the circuitry in controller 1295 may include control circuitry for controlling access across memory devices 1299-1, . . . , 1299-N and/or circuitry for providing a translation layer between host 1291 and memory system 1293.

Memory devices 1299-1, . . . , 1299-N may include, for example, a number of memory arrays 1296 (e.g., arrays of volatile and/or non-volatile memory cells). For instance, memory devices 1299-1, . . . , 1299-N may include arrays of memory cells, such as a portion of an example memory device 1300 structured to include pillars and adjacent trenches described in connection with FIG. 13 to form capacitor support structures formed according to embodiments described in FIGS. 1-11. As will be appreciated, the memory cells in the memory arrays 1296 of memory devices 1299-1, . . . , 1299-N and/or as shown at 1300 may be in a RAM architecture (e.g., DRAM, SRAM, SDRAM, FeRAM, MRAM, ReRAM, etc.), a flash architecture (e.g., NAND, NOR, etc.), a three-dimensional (3D) RAM and/or flash memory cell architecture, or some other memory array architecture including pillars and adjacent trenches.

Memory devices 1299, 1300 may be formed on the same die. A memory device (e.g., memory device 1299-1) may include one or more arrays 1296 of memory cells formed on the die. A memory device may include sense circuitry 1297 and control circuitry 1298 associated with one or more arrays 1296 formed on the die, or portions thereof. The sense circuitry 1297 may be utilized to determine (sense) a particular data value (e.g., 0 or 1) that is stored at a particular memory cell in a row of an array 1296. The control circuitry 1298 may be utilized to direct the sense circuitry 1297 to sense particular data values, in addition to directing storage, erasure, etc., of data values in response to a command from host 1291 and/or host interface 1292. The command may be sent directly to the control circuitry 1298 via the memory interface 1294 or to the control circuitry 1298 via the controller 1295.

The embodiment illustrated in FIG. 12 may include additional circuitry that is not illustrated so as not to obscure embodiments of the present disclosure. For example, memory devices 1299, 1300 may include address circuitry to latch address signals provided over I/O connectors through I/O circuitry. Address signals may be received and decoded by a row decoder and a column decoder to access a memory array 1296. It will be appreciated that the number of address input connectors may depend on the density and/or architecture of memory devices 1299, 1300 and/or memory arrays 1296.

Figure 13:
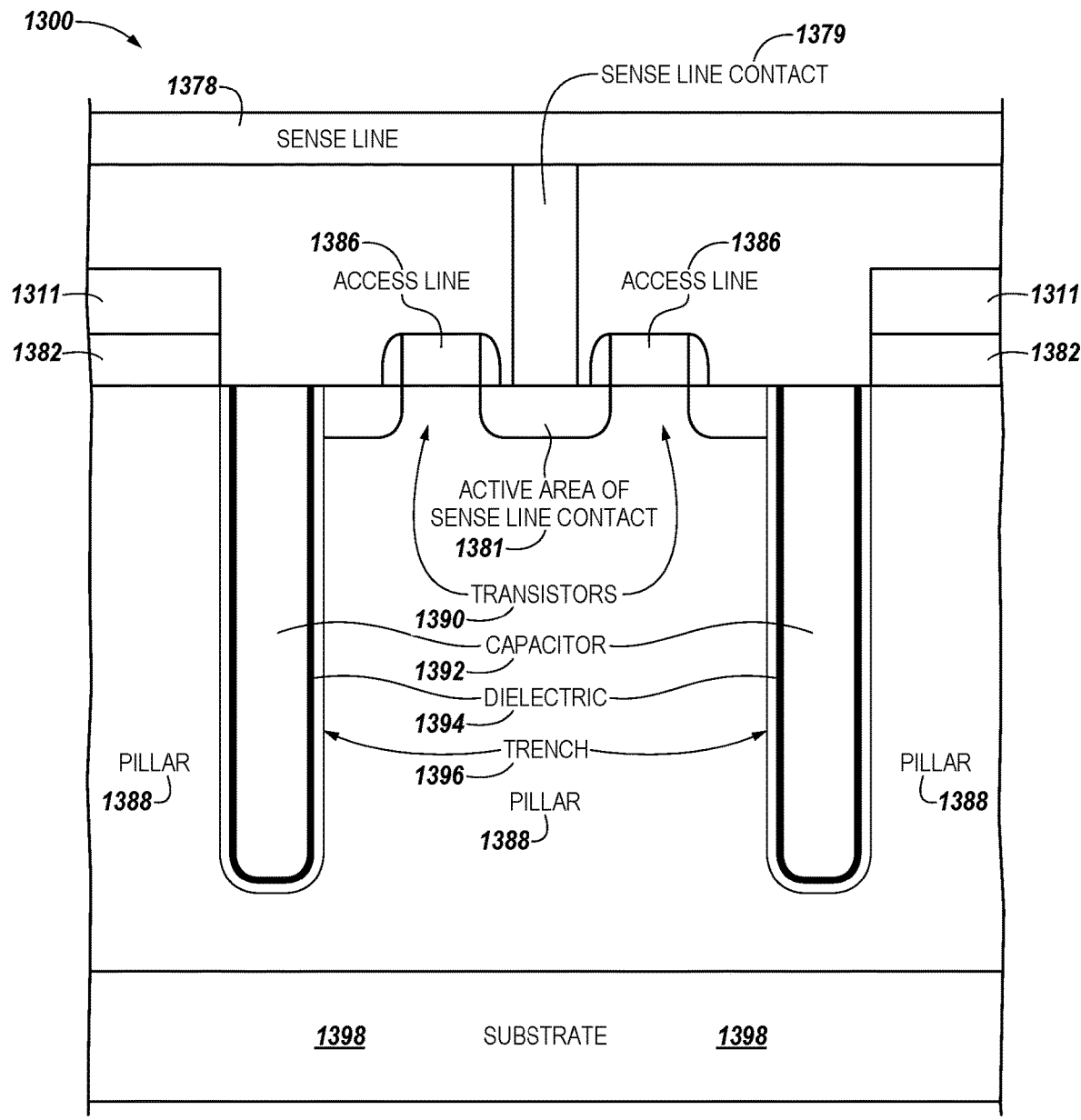
FIG. 13 illustrates a cross-sectional view of a portion of an example of semiconductor structures of a memory device that include pillars and adjacent trenches in accordance with a number of embodiments of the present disclosure.

FIG. 13 illustrates a cross-sectional view of a portion of an example of semiconductor structures of a memory device 1300 that include pillars and adjacent trenches to form capacitors and related structures according to embodiments described in FIGS. 1-11 in accordance with a number of embodiments of the present disclosure.

The portion of the memory device 1300 illustrated in FIG. 13 is shown by way of example and not by way of limitation to include a DRAM memory cell architecture. Another RAM, flash (e.g., NAND or NOR), and/or 3D memory cell architecture also may include pillars and adjacent trenches. Embodiments are not so limited. Although the DRAM transistors 1390 and capacitors 1392 are shown to be arranged in a lateral configuration, embodiments may include the transistors 1390 and capacitors 1392 being arranged in a lateral, a vertical, or any other configuration.

The portion of the memory device 1300 shown in FIG. 13 may represent two DRAM memory cells in a 1T1C (one transistor one capacitor) configuration or one DRAM memory cell in a 2T2C configuration. DRAM memory cells may utilize capacitors 1392 each formed in a trench 1396 to store a particular charge corresponding to a data value. Forming the trenches 1396 as shown in FIG. 13 may result in a pillar 1388 being formed from the etched material on each side of a trench 1396. Pillars 1388 may be formed (e.g., fabricated) as layers of doped or undoped semiconductor material deposited on a substrate material 1398. The semiconductor material may be etched to form the pillars 1388 and trenches 1396. In some embodiments, an opening (e.g., a round, square, oblong, etc., opening rather than a rectilinear trench) may be etched into the semiconductor material and capacitor material may be deposited in the opening.

Moreover, embodiments of the present disclosure are not limited to capacitors being formed in a trench for data storage, nor are embodiments limited to the trench containing capacitor material. For example, various types of memory devices may include trenches between sidewall structures (e.g., pillars) in which various materials may be positioned to contribute to data access, storage, and/or processing or in which various materials may be formed for electrical conduction and/or isolation (e.g., conductor, resistor, and/or dielectric materials), among other functions and/or operations.

In a number of embodiments, a trench 1396 may be etched to a particular depth into a pillar material. The trench 1396 may be etched into the material of the pillars 1388 to a depth approaching the substrate material 1398, as shown in FIG. 13. Alternatively, the trench 1396 may be etched into the material of the pillars 1388 to a top of or into the substrate material 1398. The depth of the trench 1396 approaching, at the top of, and/or into the substrate material 1398 is termed herein as being in the bottom region of the trench.

In addition to reducing a height (e.g., total thickness) of a capacitor support structure, as described herein, deepening (e.g., etching) the trench further into the pillar material or the substrate material may increase a surface area of the trench boundaries. In one example, increasing the surface area of the trench boundaries may increase a capacitance of a capacitor 1392 formed in the trench 1396 (e.g., by increasing a volume and/or surface area of the capacitor). In this example, the trench 1396 may be lined with a dielectric material 1394 or an electrode material (e.g., as shown at 221 in connection with FIG. 2) and a capacitor material may be formed (e.g., deposited) within the trench 1396 and on the dielectric material 1394 or electrode material 221 to form the capacitor 1392 to a particular (e.g., target) depth.

Each pillar 1388 of the pillar material may extend to a particular height above the substrate material 1398. As such, each pillar 1388 has a top surface at the particular height. A number of structural materials may be formed on or in association with the top surface of the pillar 1388 adjacent the trench 1396. For example, a particular material 1382 may be formed to contribute to data access, storage, and/or processing (e.g., conductor, resistor, and/or dielectric materials). Such a material 1382 may be formed on the top surface of the pillar 1388 adjacent the trench 1396. A mask material 1311 may be formed to protect an underlying material 1382 and/or the top surface of the pillar 1388 adjacent the trench 1396 from subsequent processing and/or wear encountered in use of the memory device 1300. Other structural materials that may be formed (e.g., in a DRAM configuration as shown in FIG. 13) on, or in association with, the top surface of the pillar 1388 adjacent the trench 1396. The other structural materials may include the transistors 1390, access lines 1386, sense lines 1378, and/or sense line contacts 1379, among other possible structural materials. A region of contact between a sense line contact and the semiconductor material may be an active area 1381 of the sense line contact. The active area 1381 also may be associated with a number of access lines 1386. The structural materials just described as being formed on and/or in association with the top surface of the pillar 1388 adjacent the trench 1396 are termed herein as being in a top region of the pillar 1388 and/or trench 1396.

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

It is to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

While example embodiments including various combinations and configurations of semiconductor materials, underlying materials, structural materials, dielectric materials, capacitor materials, substrate materials, silicate materials, nitride materials, buffer materials, etch chemistries, etch processes, supercritical drying processes, solvents, memory devices, memory cells, sidewalls of openings and/or trenches, among other materials and/or components related to semiconductor processing (e.g., of a capacitor support structure) have been illustrated and described herein, embodiments of the present disclosure are not limited to those combinations explicitly recited herein. Other combinations and configurations of the semiconductor materials, underlying materials, structural materials, dielectric materials, capacitor materials, substrate materials, silicate materials, nitride materials, buffer materials, etch chemistries, etch processes, supercritical drying processes, solvents, memory devices, memory cells, sidewalls of openings and/or trenches related to semiconductor processing than those disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
    patterning a surface of a semiconductor substrate to have:
        a first silicate material;
        a nitride material over the first silicate material; and
        a second silicate material over the nitride material; and
    removing the first silicate material and the second silicate material;
    leaving the nitride material as a support structure for a column formed from a capacitor material; and
    performing supercritical drying on the column, after removal of the first and second silicate materials, to reduce a probability of the column wobbling relative to otherwise drying the column after the removal of the first and second silicate materials.

2. The method of claim 1, further comprising forming the capacitor material in an opening through the first silicate material, the nitride material, and the second silicate material.

3. The method of claim 1, further comprising reducing by reduction of the wobbling a probability, during subsequent use of a memory device, of a short circuit fault of a capacitor formed from the capacitor material.

4. The method of claim 1, further comprising:
positioning the support structure between the first and second silicate materials in a range of from forty percent (%) to 60% of a height of the column formed from the capacitor material; and
using the support structure as a single support for the column above the surface of the semiconductor substrate.

5. The method of claim 1, further comprising:
forming the column to a height in a range of from 800 nanometers (nm) to 1,500 nm;
forming the column to a width in a range of from 20 nm to 60 nm; and
forming the column to have an aspect ratio (AR) of the height to width being in a range of from 25:1 to 50:1.

6. The method of claim 1, further comprising forming the capacitor material to a particular height, a particular width, and a particular aspect ratio (AR) to conform to a particular critical dimension (CD) suited for formation of an operable capacitor for a semiconductor device.

7. The method of claim 1, wherein performing supercritical drying comprises using carbon dioxide ($CO_2$) at a temperature in a range of from 20 degrees Celsius (° C.) to 100° C., at a pressure in a range of from 5 megapascals (MPa) to 60 MPa, and for a time period in a range of from 60 seconds to 300 seconds.

8. The method of claim 1, wherein otherwise drying the column comprises using isopropyl alcohol to dry the column after removal of the first and second silicate materials.

9. A portion of a memory device formed by the method of claim 1, wherein:
the memory device comprises a memory cell that includes:
a capacitor, as a data storage node, that comprises the capacitor material and is supported by the support structure; and
an access device coupled to the capacitor.

10. A method, comprising:
patterning a surface of a semiconductor substrate to have:
a first silicate material;
a nitride material over the first silicate material; and
a second silicate material over the nitride material; and
removing the first silicate material and the second silicate material;
leaving the nitride material as a support structure for a column formed from a capacitor material;
using supercritical carbon dioxide ($CO_2$) to dry the column after removal of the first and second silicate materials; and
increasing a capacitance of a capacitor that comprises the column formed from the capacitor material relative to a different support structure using a plurality of separate materials as support for the capacitor above the surface of the semiconductor substrate.

11. The method of claim 10, further comprising increasing an exposed surface area of the capacitor to increase the capacitance by reduction of a total height of the support structure formed between the surface of the semiconductor substrate and a top of the capacitor.

12. The method of claim 10, wherein increasing the capacitance comprises maintaining a same height of a capacitor formed in the different support structure by reduction of a total height of the support structure.

13. The method of claim 10, wherein increasing the capacitance comprises:
improving an ability to distinguish a potential first data value from a potential second data value stored by the capacitor by;
enabling an improved ability to distinguish a low charge from a high charge associated with the first and second data values.

14. The method of claim 10, wherein increasing the capacitance comprises decreasing a frequency of a refresh operation performed on the capacitor relative to a capacitor of the same height used in the different support structure.

15. The method of claim 10, wherein patterning the surface comprises patterning the surface such that a height of each of the first silicate material and the second silicate material is in a range of from 400 nanometers (nm) to 800 nm.

16. The method of claim 10, wherein patterning the surface comprises patterning the surface such that a height of the nitride material is in a range of from 20 nanometers (nm) to 50 nm.

17. The method of claim 10, wherein patterning the surface comprises patterning the surface without another material formed as support for the column above the surface of the semiconductor substrate or associated with a top of the column.

18. The method of claim 10, wherein patterning the surface comprises forming one of either the first silicate material and the second silicate material from one of a borophosphosilicate glass (BPSG) material and a tetraethyl orthosilicate (TEOS) material.

19. A method, comprising:
patterning a surface of a semiconductor substrate to have:
a first silicate material;
a nitride material over the first silicate material; and
a second silicate material over the nitride material; and
removing the first silicate material and the second silicate material;
leaving the nitride material as a single support structure for a column formed from a capacitor material; and
reducing a surface tension force at a phase boundary by using supercritical carbon dioxide ($CO_2$) to dry the column after removal of the first and second silicate materials; wherein:
by reduction of the surface tension force during the drying, a probability of the column wobbling is reduced relative to otherwise drying the column; and
by reduction of the probability of the column wobbling, the nitride material is enabled to be the single support structure for the column.

20. The method of claim 19, wherein the reduction of the probability of the column wobbling further comprises:
enabling an increased density of a plurality of capacitors to be formed over the semiconductor substrate; and
reducing, during subsequent use of a memory device, a probability of a short circuit fault of a capacitor at the increased density.

21. The method of claim 20, wherein patterning the surface of the semiconductor substrate further comprises:

forming a number of electrode and dielectric materials over a surface of the column of the capacitor material; and using isopropyl alcohol to perform one or both of removal of residual material, resulting from processing the electrode and dielectric materials, and drying remaining electrode and dielectric materials over the surface of the column.

22. The method of claim 19, further comprising, by use of the single support structure, increasing a capacitance of a capacitor that comprises the column relative to a different support structure using a plurality of separate materials as support for the capacitor above the surface of the semiconductor substrate.

23. The method of claim 19, wherein the reduction of the probability of the column wobbling further comprises:

enabling reduction of a height of the nitride material as the single support structure to be in a range of from 5 nanometers (nm) to 15 nm relative to, when otherwise drying the column, a different support structure having either or both of:

a nitride material over the first silicate material being in a range of from 20 nm to 50 nm; and a second nitride material over the second silicate material, and associated with a top of the column, being in a range of from 20 nm to 150 nm.

24. The method of claim 19, wherein patterning the surface of the semiconductor substrate further comprises:

removing, with a selective solvent, the first silicate material and the second silicate material; and leaving the column formed from the capacitor material.

25. The method of claim 19, wherein patterning the surface of the semiconductor substrate further comprises:

removing, with a selective solvent, the first silicate material and the second silicate material;

leaving the column formed from the capacitor material having an electrode material formed over an outer surface thereof; and leaving the nitride material as the support structure for a capacitor that comprises the capacitor material and the electrode material.

* * * * *